(12) United States Patent
Ukiyo et al.

(10) Patent No.: US 6,551,908 B2
(45) Date of Patent: Apr. 22, 2003

(54) METHOD FOR PRODUCING SEMICONDUCTOR THIN FILMS ON MOVING SUBSTRATES

(75) Inventors: Noritaka Ukiyo, Nara (JP); Tetsuro Saito, Kanagawa (JP); Tatsumi Shoji, Kanagawa (JP); Makoto Iwakami, Kanagawa (JP); Takehito Yoshino, Kyoto (JP); Shoji Nishida, Nara (JP); Masaaki Iwane, Nara (JP); Masaki Mizutani, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/964,332

(22) Filed: Sep. 28, 2001

(65) Prior Publication Data

US 2002/0061632 A1 May 23, 2002

(30) Foreign Application Priority Data

Oct. 2, 2000 (JP) ........................................ 2000-302451

(51) Int. Cl.$^7$ .......................... C30B 1/00; H01L 21/20; H01L 21/36
(52) U.S. Cl. ....................... 438/478; 438/479; 438/492; 117/54
(58) Field of Search ................................ 438/478, 479, 438/492, 497–502; 117/60, 61

(56) References Cited

U.S. PATENT DOCUMENTS

| 4,243,472 | A | * | 1/1981 | O'Neill | 117/60 |
| 4,614,672 | A | * | 9/1986 | Addamiano | 117/56 |
| 5,254,211 | A | * | 10/1993 | Yonehara | 117/79 |
| 5,575,855 | A | | 11/1996 | Kanai et al. | 118/718 |
| 5,575,862 | A | | 11/1996 | Nishida | 136/258 |
| 5,584,941 | A | | 12/1996 | Nishida | 136/258 |
| 6,273,955 | B1 | | 8/2001 | Yoshino et al. | 118/718 |

FOREIGN PATENT DOCUMENTS

| JP | 361202411 A | * | 9/1986 | | 117/60 |
| JP | 64-072988 | | 3/1989 | | C30B/19/00 |
| JP | 405102052 A | * | 4/1993 | | 118/409 |
| JP | 05-330979 | | 12/1993 | | C30B/19/06 |
| JP | 05-330984 | | 12/1993 | | C30B/19/06 |

* cited by examiner

*Primary Examiner*—John F. Niebling
*Assistant Examiner*—Angel Roman
(74) *Attorney, Agent, or Firm*—Fitzpatrick, Cella, Harper & Scinto

(57) ABSTRACT

A method for producing semiconductor thin films in which the semiconductor thin films are allowed to grow on a plurality of substrates by dipping the plurality of substrates into a solution filled in a crucible, the solution containing a semiconductor as a solute, while moving the same in the solution. An angle between a direction of a normal line on a central portion of a growing surface of each substrate and the direction of the movement of the substrates is set to be in 87 degrees or less and the movement of the substrates generates a flow of the solution.

19 Claims, 21 Drawing Sheets

METHOD FOR PRODUCING SEMICONDUCTOR THIN FILMS ON MOVING SUBSTRATES

BACKGROUND OF THE INVENTION

1. Field of the Invention

The present invention relates to a liquid phase growth method and a liquid phase growth apparatus, specifically to a liquid phase growth method and a liquid phase growth apparatus for forming substrates which can be used for producing semiconductor devices, in particular, such as solar cells and optical sensors.

2. Related Background Art

As the global warming is becoming more serious, there has arisen a movement to limit $CO_2$ emissions worldwide. And attention is now being directed to the solar cell power generation which emits no $CO_2$ at the time of power generation.

Crystal silicon-based solar cells utilizing single-crystalline or polycrystalline silicon are high in photoelectric conversion efficiency and low in degradation, as compared with amorphous Si-based solar cells, but have the disadvantage of high production costs. In order to reduce such costs, in recent years attempts have been carried out to make thin a crystalline portion of silicon which is to be a power generating layer.

The crystalline Si-based solar cell made in a thin film state can withstand a certain bend; therefore, the shape of the solar cell as a product can be freely selected to some extent, and in some cases, the solar cell can be adhered to a curved surface.

One of the methods for forming single- or poly-crystalline Si which is to be a power generating layer of solar cells is the liquid phase growth method. The liquid phase growth method does not waste raw materials and allows obtaining a thin film having a necessary thickness as a power generating layer inexpensively, as compared with a vapor phase growth. Therefore, in order to improve the mass production of the thin films, there have been demands for a liquid phase growth method and an apparatus therefore which make it possible to treat a plurality of substrates together.

As a concrete example of the methods for treating a plurality of substrates together, Japanese Patent Application Laid-Open No. 1-72988 discloses a liquid phase growth method for treating a plurality of substrates together. A state in which this liquid phase growth method is carried out is shown in FIGS. 1A and 1B. In FIGS. 1A and 1B, reference numeral 101 denotes a substrate holder, numeral 102 a graphite container, numeral 103 a solution, and numeral 104 substrates.

FIG. 1A shows a state in which the substrates 104 are arranged horizontally to the solution surface and FIG. 1B a state in which the substrates 104 are arranged perpendicularly to the solution surface. In this treatment apparatus, a semiconductor layer is formed on each of the substrate 104 by dipping the substrate in the solution 103 stored in the graphite container 102.

Similarly, Japanese Patent Application Laid-Open No. 5-330984 discloses a liquid phase growth method, in which a plurality of substrates are arranged horizontally to the solution surface and a dipping process is adopted, and a holder used in the method.

The configuration of the liquid phase growth apparatus is shown in FIGS. 2 and 3. In FIG. 2, reference numeral 201 denotes a vertical barrel type reactor core, numeral 203 a crucible, numeral 204 a heater, numeral 103 a solution, numeral 104 growing substrates, numeral 209 a substrate holder, and numeral 220 a holding rod. FIG. 3 shows a substrate holder, in which reference numeral 210 denotes an attaching frame, numeral 215 a holding frame, numeral 216 side-legs, numeral 216a slotted holes, numeral 218b engaging pins, numeral 217 a bottom plate, and numeral 218 spacers.

A plurality of substrates 104 for growth which are held by each spacer can be housed in the holder. And as seen from FIG. 2, the substrates 104 for growth are held horizontally to the surface of the solution 103.

Japanese Patent Application Laid-Open No. 5-330979 discloses a liquid phase growth method, in which a plurality of substrates are arranged perpendicularly to the solution surface and a dipping process is adopted, and a holder used in the method. The configuration of the liquid phase growth apparatus is shown in FIG. 4. In FIG. 4, reference numeral 310 denotes an electric furnace, numeral 203 a crucible, numeral 103 a solution, numeral 312 substrates for growth which can be attached to a holding rod, numeral 315 a holding rod, numeral 317 a driving means, numeral 318 a holder, and numeral 319 a lifter.

The substrates 312 are held perpendicularly to the solution surface, and at the time of lowering the holding rod 315, the substrates are dipped in the solution 103 to start crystal growth.

In the liquid phase growth methods disclosed in Japanese Patent Application Laid-Open No. 1-72988 and Japanese Patent Application Laid-Open No. 5-330984, at the time of holding the substrates horizontally to the solution surface, since the solution depths of the dipped substrates are different from each other, the growth conditions of the substrates vary from each other, thereby giving rise to a problem of non-uniformness in crystal film thickness among the substrates.

On the other hand, like the liquid phase growth method disclosed in Japanese Patent Application Laid-Open No. 5-330979, when holding the substrates perpendicularly to the solution surface and rotating the substrate in the plane thereof, fluctuations in film thickness are decreased; however, since the substrates themselves are fixed to the holding rod in such a manner that the rod penetrates through the substrate, they are required to have a hole drilled therein, which means the drilled portions cannot be used for crystal growth. Further, since each substrate rotates on its center in a predetermined position, there arises a problem of limiting the supply of the solution to the substrate surface, thereby not making it possible to speed up the film deposition. And furthermore, the substrate arrangement of the prior art makes it difficult to treat many substrates together.

SUMMARY OF THE INVENTION

The present invention has been achieved under such circumstances as described above. Accordingly, a primary object of the present invention is to provide a method and an apparatus for producing semiconductor thin films which can ensure improvement in mass production by treating a plurality of substrates together while making full use of the characteristics of the liquid phase growth method and which can also ensure crystal films having uniform thickness and high quality.

In order to attain the above object, the present invention provides a method for producing semiconductor thin films, which comprises dipping a plurality of substrates into a solution filled in a crucible, the solution containing a semiconductor as a solute, and growing the semiconductor thin films on the plurality of substrates while moving the plurality of substrates in the solution, wherein an angle between the direction of a normal line on the central portion of a growing surface of each of the above substrates and the direction of the movement of the above substrates is set to be in a range of 5 degrees to 87 degrees, and wherein the movement of the above substrates generates the flow of the above solution.

Further, the present invention provides a method for producing semiconductor thin films, which comprises dipping a plurality of substrates into a solution filled in a crucible, the solution containing a semiconductor as a solute, and growing the semiconductor thin films on the plurality of substrates while moving the plurality of substrates in the solution, wherein an angle between the direction of a normal line on the central portion of a growing surface of each of the above substrates and the direction of the movement of the above substrate is set to be in a range of 93 degrees to 175 degrees, and wherein the movement of the above substrates generates the flow of the above solution without generating a substantial vortical flow in the vicinity of the above growing surface.

Further, the present invention provides an apparatus for producing semiconductor thin films, which comprises: a crucible filled with a solution containing a semiconductor as a solute; means for controlling the temperature of the above crucible; substrate moving means for moving a plurality of substrates as an integral unit in the above solution; and substrate holding means for holding the substrates in such a manner that an angle between the direction of a normal line on the central portion of each of the above substrates and the direction of the movement of the above substrate is set to be in a range of 5 degrees to 87 degrees or 93 degrees to 175 degrees.

The term "the direction of a normal line on the central portion of a growing surface of each substrate" herein used means that the direction of a vector drawn away from the substrate surface as a starting point along the normal line on the growing surface of each substrate. And the term "the direction of the movement of the substrates" herein used means that the direction of a vector showing the movement of the center of gravity of each substrate.

DETAILED DESCRIPTION OF THE PREFERRED EMBODIMENTS

The reasons for the variations in film thickness and quality among the semiconductor thin films growing on respective substrates and for the wide distribution of the thickness and quality in a single substrate surface are that the concentration of the solute (a semiconductor such as silicon) of the solution in the crucible and the temperature of the solution differ from part to part. And, as means for minimzing the above variations and distribution, it is considered that an agitating mechanism is provided within the crucible so as to forcibly circulate the solution; however, this is not preferable because the apparatus becomes intricate and a wider space is required within the crucible. Thus, in the present invention, means for effectively agitating the solution and enhancing the uniformity of the solution is provided without any intricate mechanism.

Figure 28:
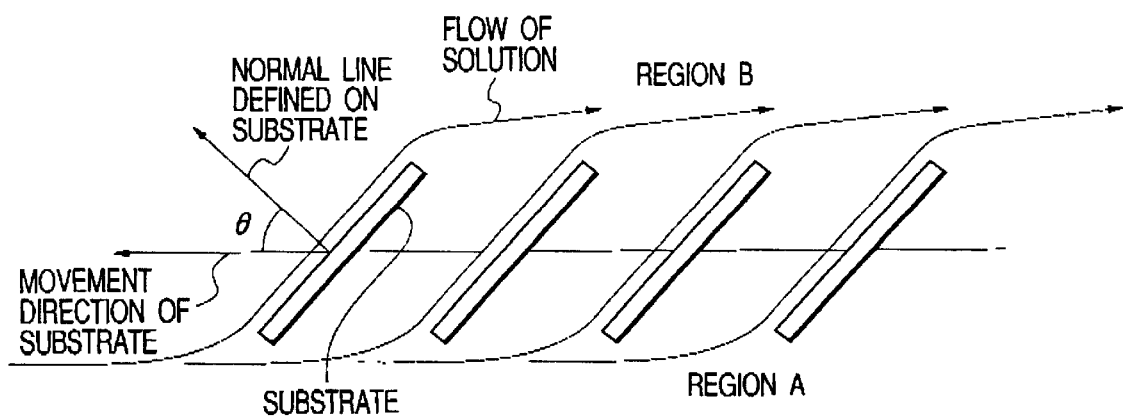
FIGS. 28, 29, 30, 31, 32 and 33 are views illustrating a solution flow generated at the time of dipping and moving a plurality of substrates in a crucible filled with a solution.

That is, as shown in FIG. 28, in growing a semiconductor thin film on a predetermined surface (growing surface) of each of the plurality of substrates, which have been dipped into a solution containing a semiconductor which is filled in a crucible, while moving the substrates as an integral unit in the predetermined direction, each substrate is arranged in such a manner that the normal line on the center of the growing surface of each substrate thereof makes a predetermined angle of θ degrees to the direction of the substrate movement. As a result, the solution flows along the surface of each substrate and moves from region A at one side of the substrate line consisting of multiple substrates to region B at the other side of the same substrate line. Since the flow crossing the substrate line from the region A to the region B can generate the circulation of the solution in the crucible, the solute concentration and the temperature become uniform in the solution.

Figure 29:
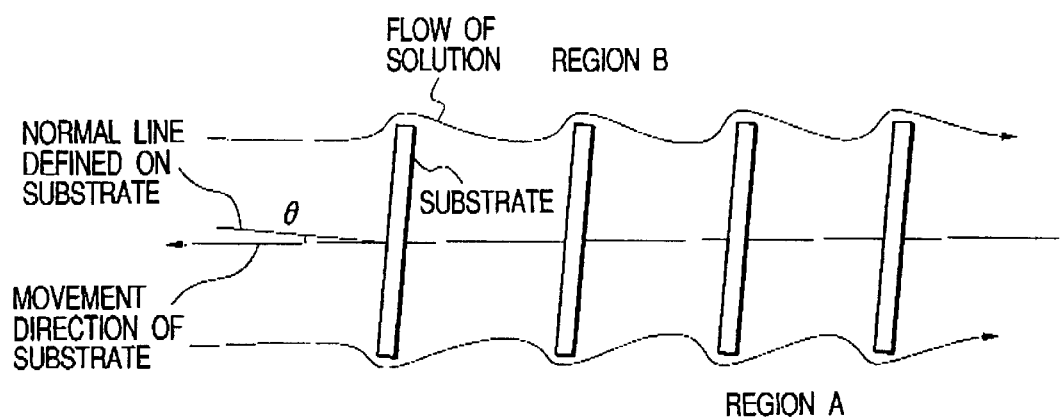

However, if the angle θ is too small, the flow of the solution is blocked by the ends of each substrate and does not cross the substrate line, as shown in FIG. 29, consequently the flow from the region A to the region B cannot be generated. Further, the solution holds up between the substrates and the concentration of the solute is likely to decrease locally at the central portion of each substrate. The angle θ of 5 degrees or less may cause such a situation.

Figure 30:
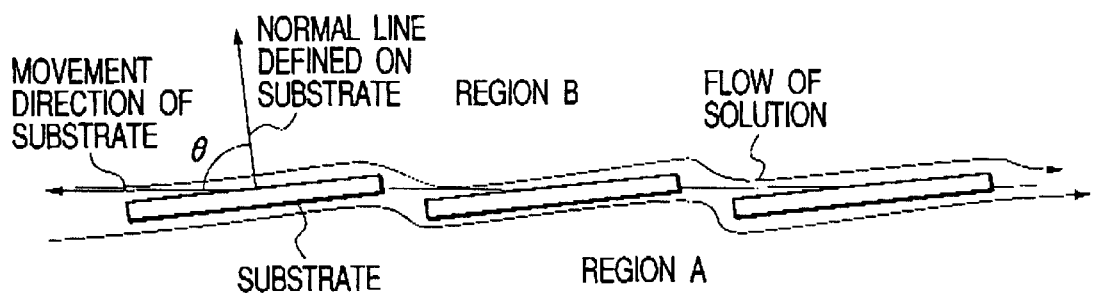

On the other hand, if the angle θ is too large, though the smooth flow of the solute along the substrate surface can be generated, the force generating the flow crossing the substrate line is insufficient, as shown in FIG. 30, consequently the flow from the region A to the region B cannot be generated. The angle θ of 87 degrees or more may cause this situation.

Figure 31:
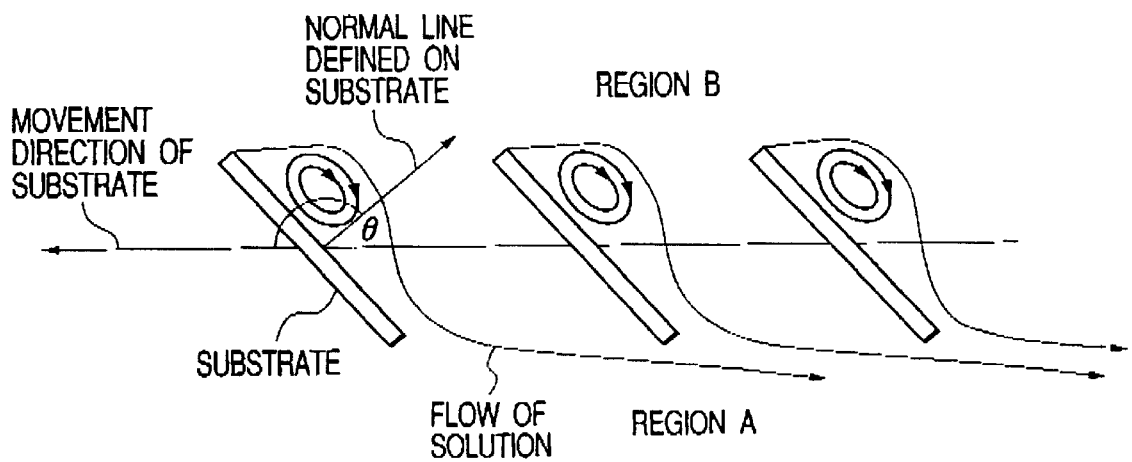

The angle θ can be larger than 90 degrees. In this case, the growing surface of each substrate faces downstream; however, since the flow of the solution along the substrate surface is generated, semiconductor films can grow. Basically, the conditions under which the flow from the region A to the region B is generated can be considered to be the same as the case where the angle θ is smaller than 90 degrees. To be concrete, the suitable angle θ is in the range of 93 degrees to 185 degrees. However, since the growing surface of each substrate faces downstream, a vortical flow can sometimes be generated on the downstream side of each substrate, as shown in FIG. 31. Since the solution circulates in the vortical flow and the mixing of the solution inside and outside the vortical flow is limited, the concentration of the solute decreases in the vortical flow, causing a decrease in thickness of the semiconductor thin film on the part of the growing surface having been in contact with the vortical flow. Accordingly, in such a case, special care must be taken at the time of selecting conditions such as the size and shape of each substrate and the flow rate of the solution.

The conditions, such as the size and shape of the above substrates and the flow rate of the solution. in the present invention mean the conditions under which the movement of the substrates generates no substantial vortical flow in the vicinity of the above growing surface. The conditions of "generating no substantial vortical flows" herein used does not mean that there exist no vortical flow, but means that there exist no vortical flow which affects growth of a semiconductor film.

Figure 1A:
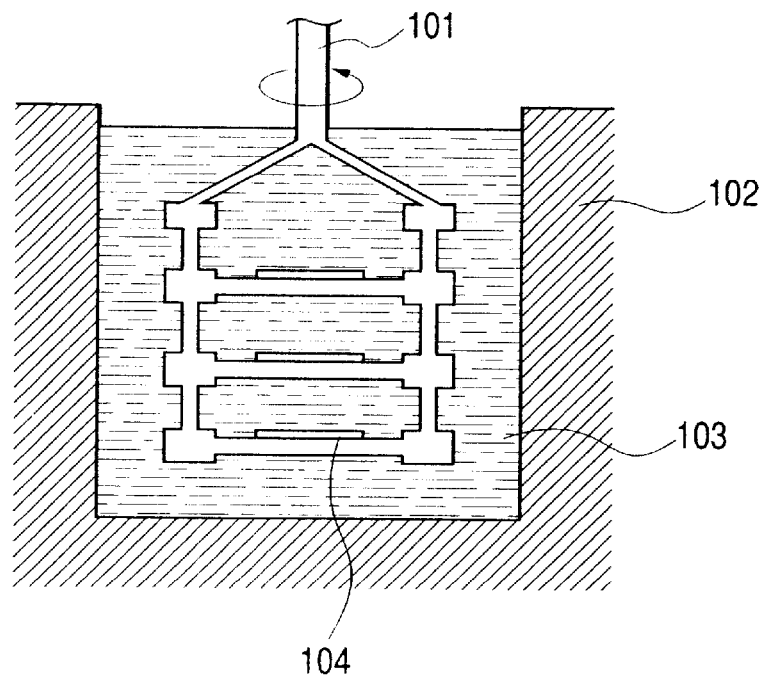
FIGS. 1A and 1B are sectional views of a dipping type Si liquid phase growth apparatus of the prior art.
Figure 1B:
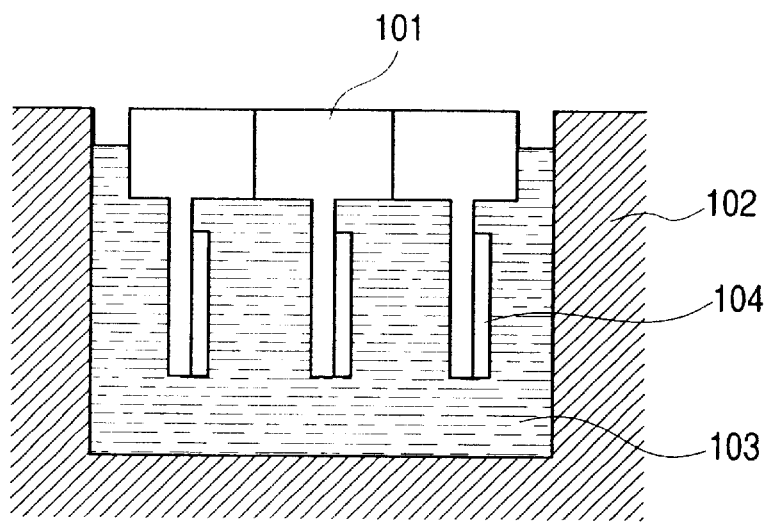
Figure 2:
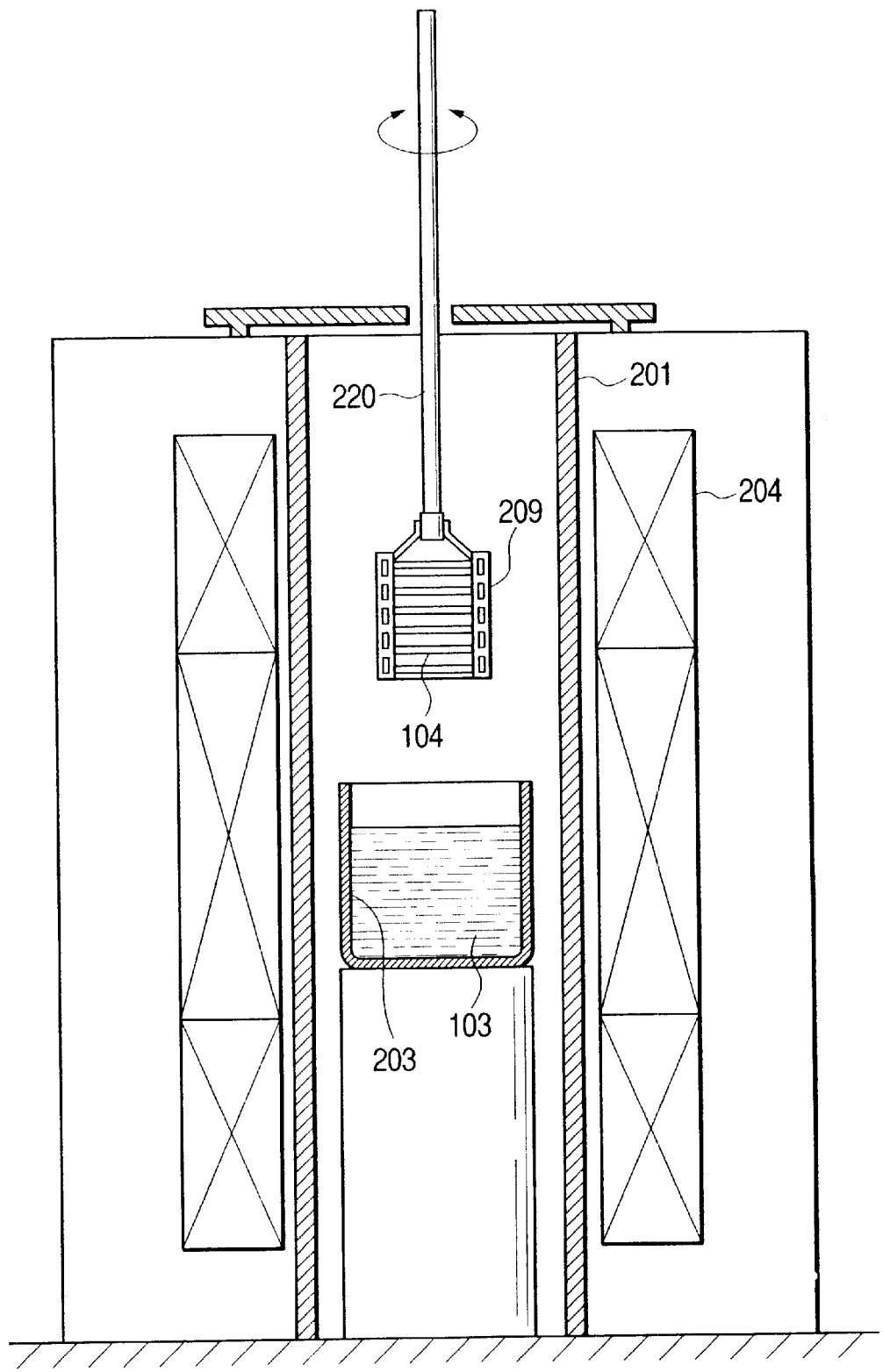
FIG. 2 is a sectional view of the dipping type Si liquid phase growth apparatus of the prior art.
Figure 3:
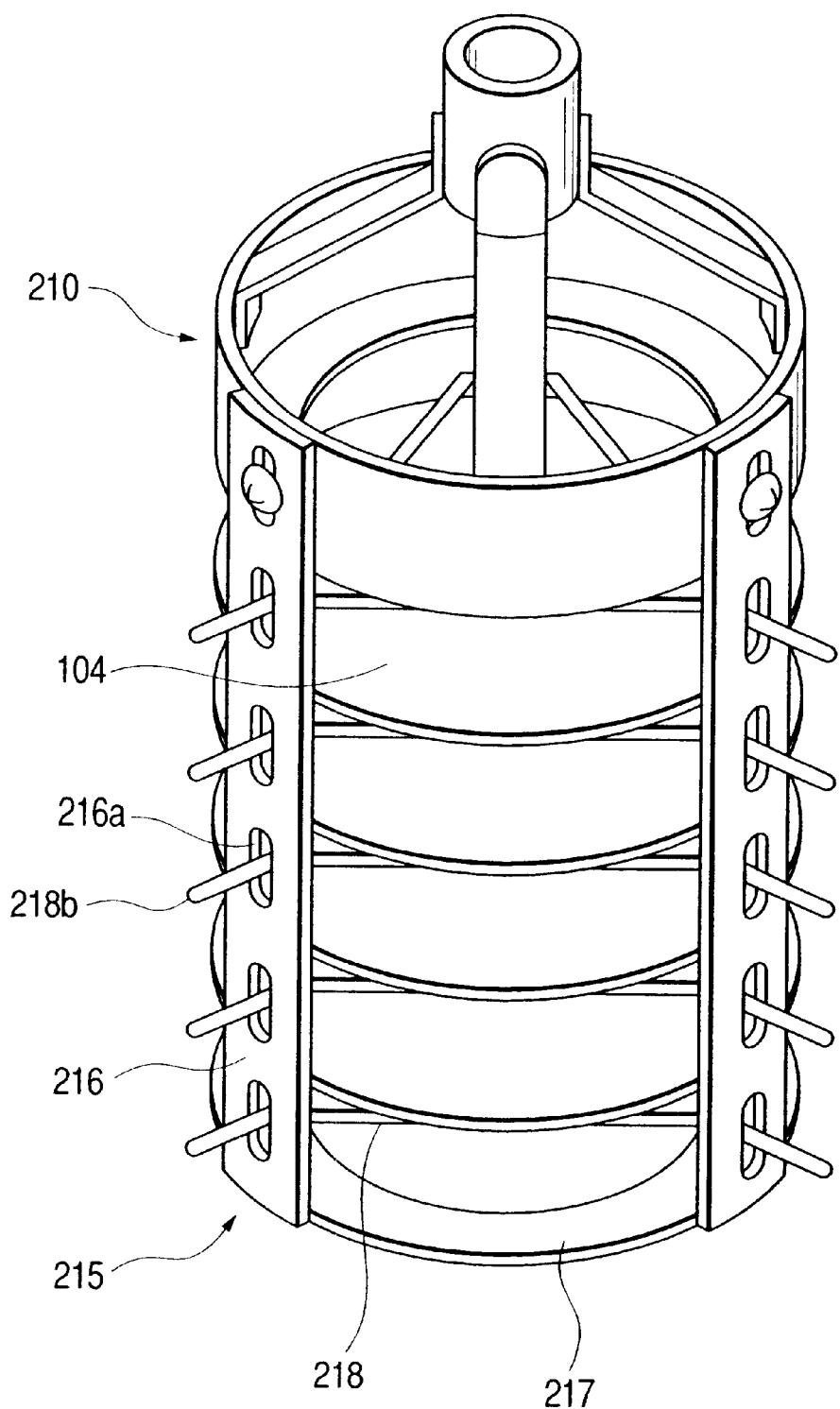
FIG. 3 is a perspective view showing a main part of the apparatus of FIG. 2.
Figure 4:
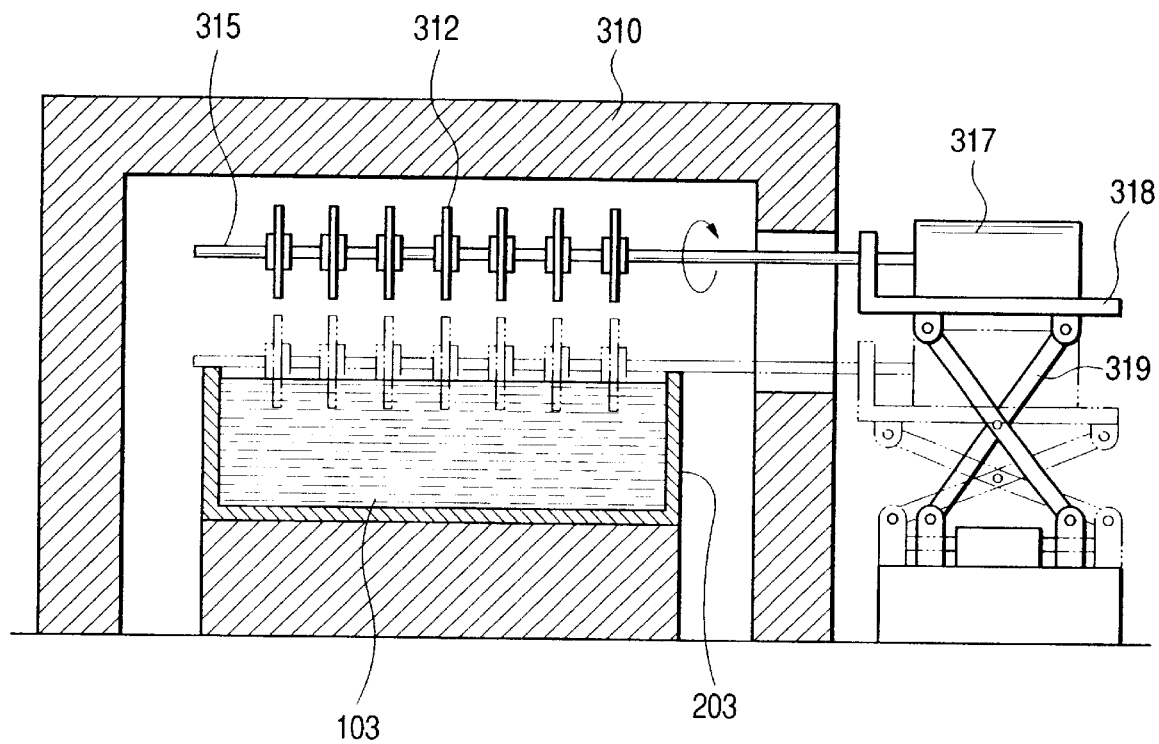
FIG. 4 is a sectional view of the dipping type Si liquid phase growth apparatus of the prior art.
Figure 5:
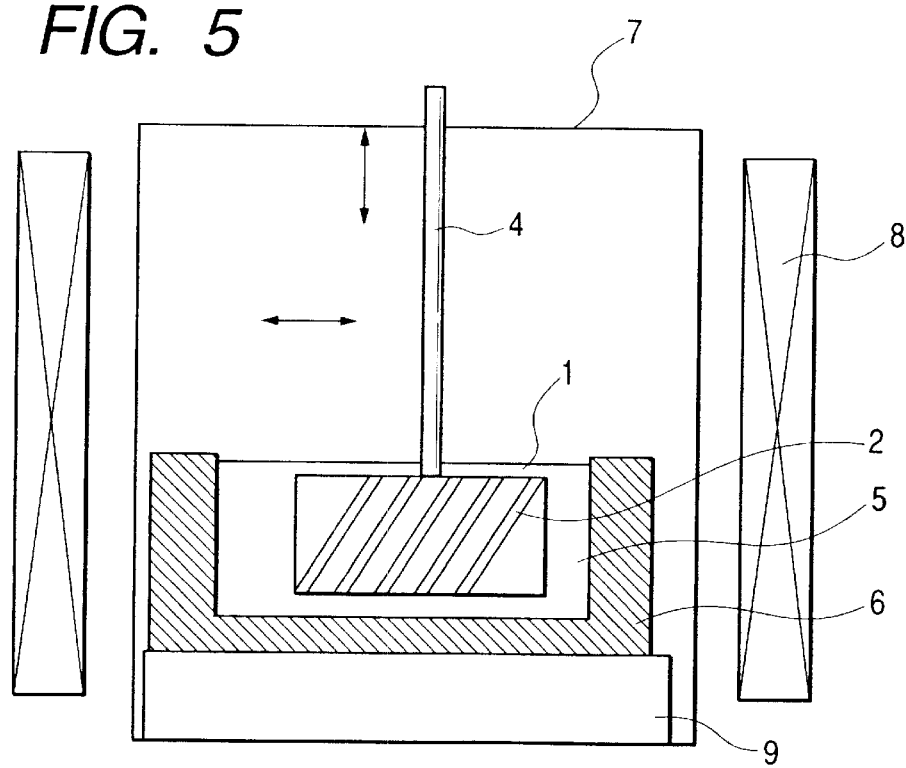
FIG. 5 is a schematic side view of a liquid phase growth apparatus in accordance with Embodiment 1 of the present invention.
Figure 9:
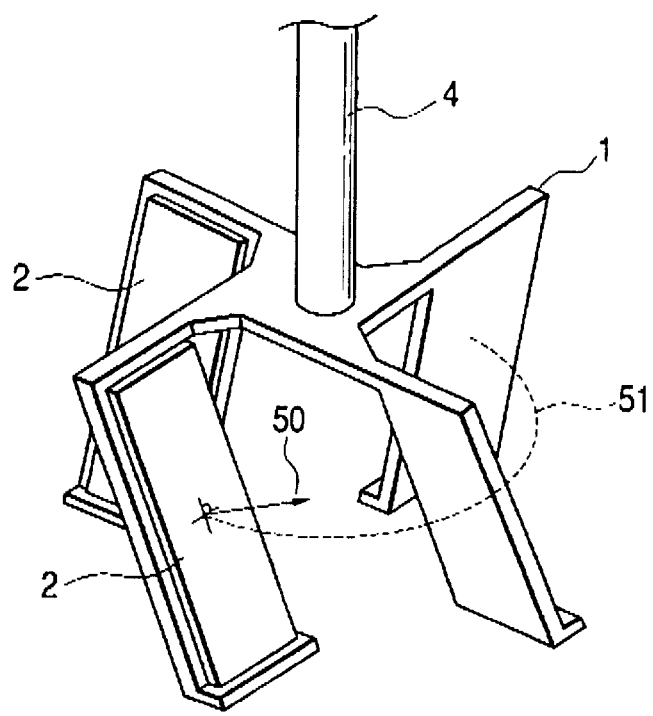
FIG. 9 is a perspective view of a substrate holder (substrate-supporting stand) of the present invention.

The types of the substrate movement include, for example, a reciprocating motion on a straight line and a rotational motion, and they can be easily realized by the reciprocating motion of the substrate holder, as shown in FIG. 5, and by the rotational motion of the substrate holder, as shown in FIG 9.

The types of the substrate movement also include a spiral motion which can be realized by the rotation and up-and-down motion of the substrate holder.

While maintaining the angle θ at the same value, the plane formed by the normal line on the center of the growing surface and the direction of the substrate movement can be turned in the various direction. The typical examples include the case where the above plane stands almost vertically and the case where the above plane lies almost horizontally. The term "almost" herein used means that a certain degree of error is permissible, and concretely the permissible error is about ±1 degree.

As described above, the direction of the substrate movement means "the direction of a vector showing the movement of the center of gravity of the substrate", and when the substrate movement is a curvilinear motion, such as a rotational motion, it is the direction of the tangent to the locus of the center of gravity of the substrate (in other words, a vector of the locus for a infinitesimal length of time). As shown in FIG. 28, in the case where the above plane almost vertically stands, if the angle θ is in the range of 5 degrees to 87 degrees, the solution creates a flow rising from the bottom of the crucible toward the surface of the solution. And as shown in FIG. 31, if the angle θ is in the range of 93 degrees to 175 degrees, the solution creates a flow falling from the surface of the solution toward the bottom of the crucible.

Figure 32:
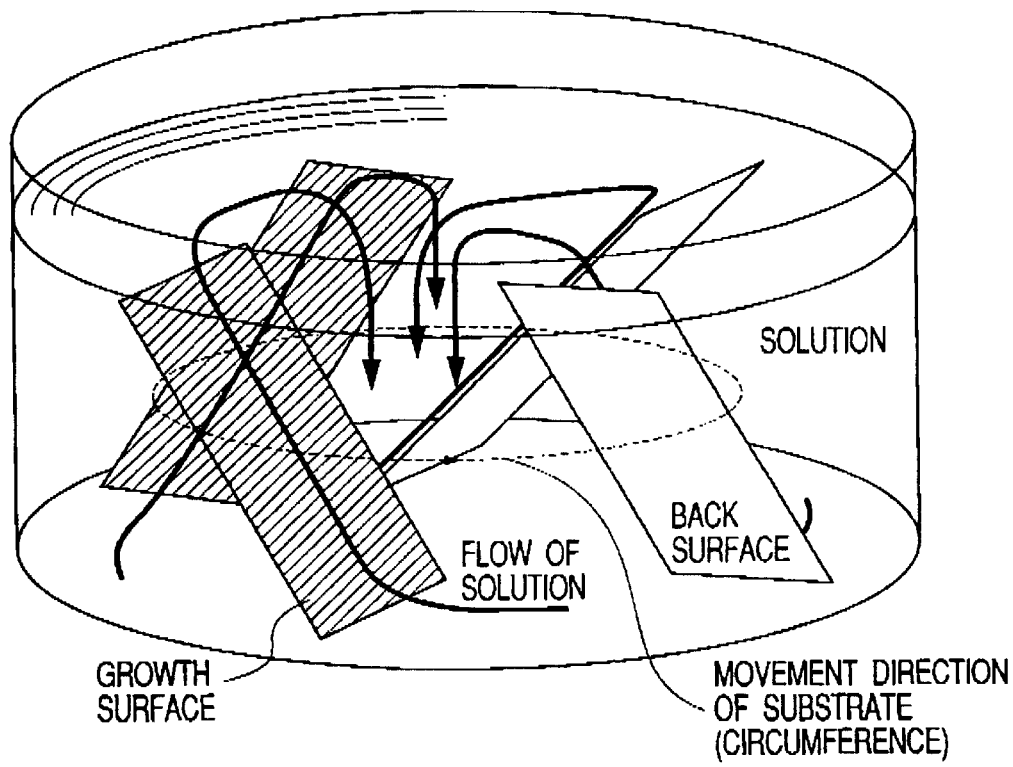
Figure 33:
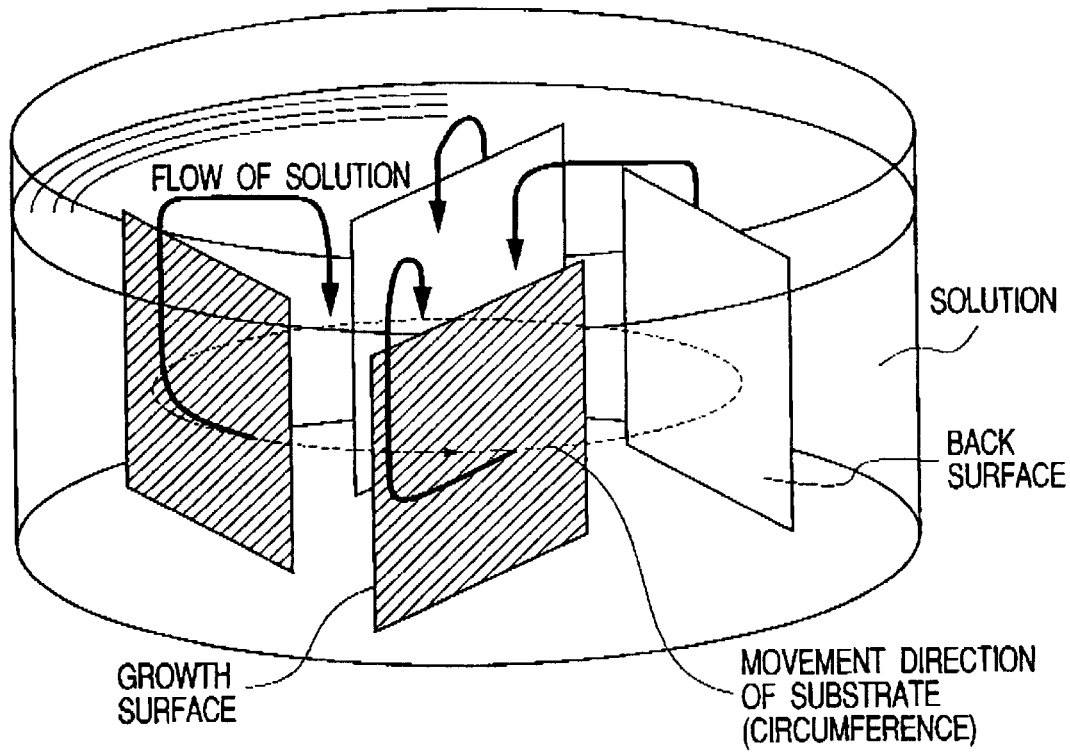

As for the way to arrange a plurality of substrates, when arranging the substrates in such a manner as to allow the center of the growing surface of each substrate to be on a given straight line or curve and moving them as an integrated unit, every solution flow created by the substrates cooperates with each other and an effective circulation of the solution is created in the crucible. Particularly when the substrate movement is a circular motion, the circulation of the solution is created more effectively by spacing the substrates at equal intervals along the circumference having a given straight line as a central axis in such a manner that they have rotational symmetry; setting the angle θ to a suitable value; and rotating the substrates as an integrated unit. FIG. 32 shows a case where four substrates are arranged in a solution filled into a cylindrical crucible in such a manner that the angle θ is 45 degrees and the plane formed by the angle θ vertically stands. In this case, the spacing between the circumferential end of each substrate and the internal surface of the crucible is narrowed to the extent that the substrate movement is not hindered. The solution is scooped up from the bottom of the crucible toward the surface of the solution by the substrates performing a rotational movement, is moved to the center of the crucible, and falls down in the vicinity of the central axis of the crucible. Thus, as illustrated in FIG. 32, the solution circulates through the crucible. FIG. 33 shows a case where four substrates are arranged in a solution filled into a cylindrical crucible in such a manner that the angle θ is 45 degrees and the plane formed by the angle θ horizontally lies. In this case, the spacing between the bottom end of each substrate and the bottom of the crucible is narrowed to the extent that the substrate movement is not hindered. The solution is pushed out from the vicinity of the central axis of the crucible toward the circumference of the central axis, rises to the surface, and falls down in the vicinity of the central axis of the crucible. Thus, as illustrated in FIG. 33, the solution circulates through the crucible.

Figure 12:
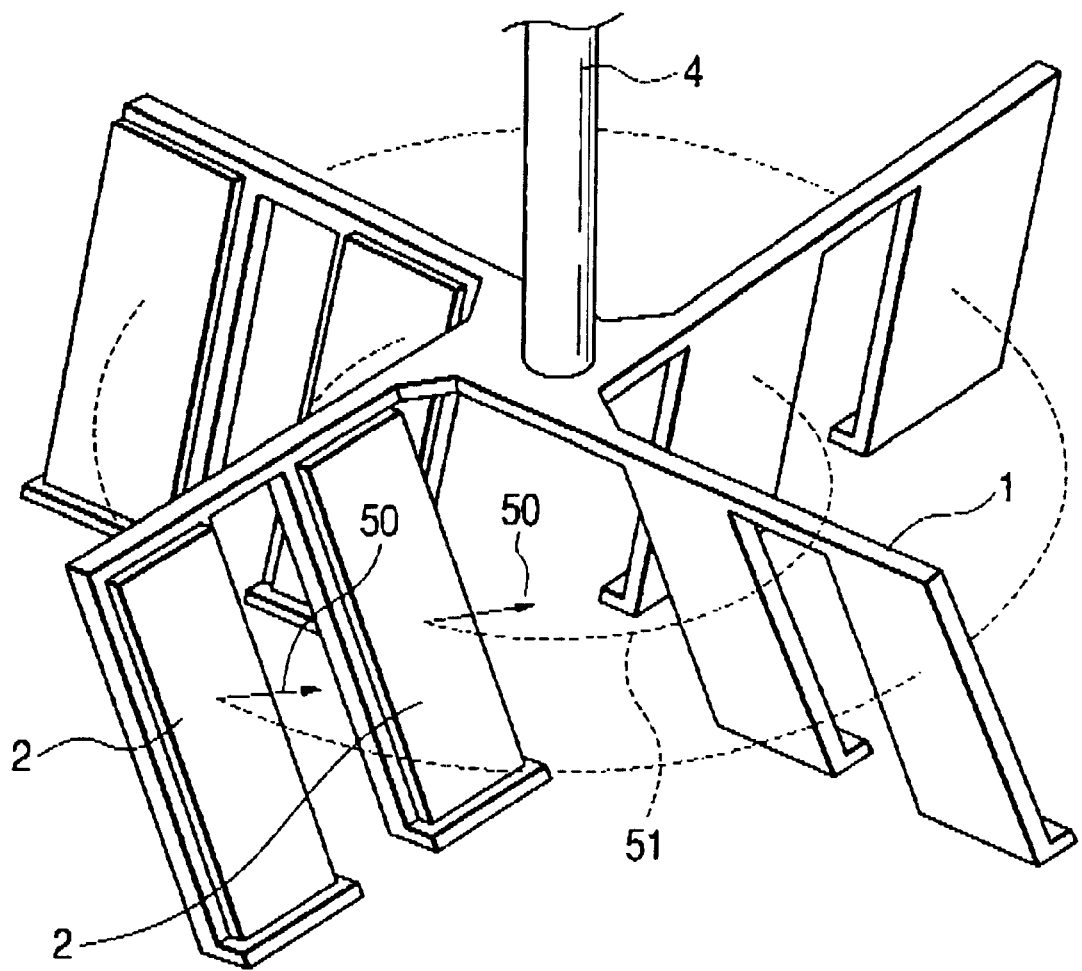
FIG. 12 is a perspective view of another example of the substrate holder of the present invention.
Figure 13:
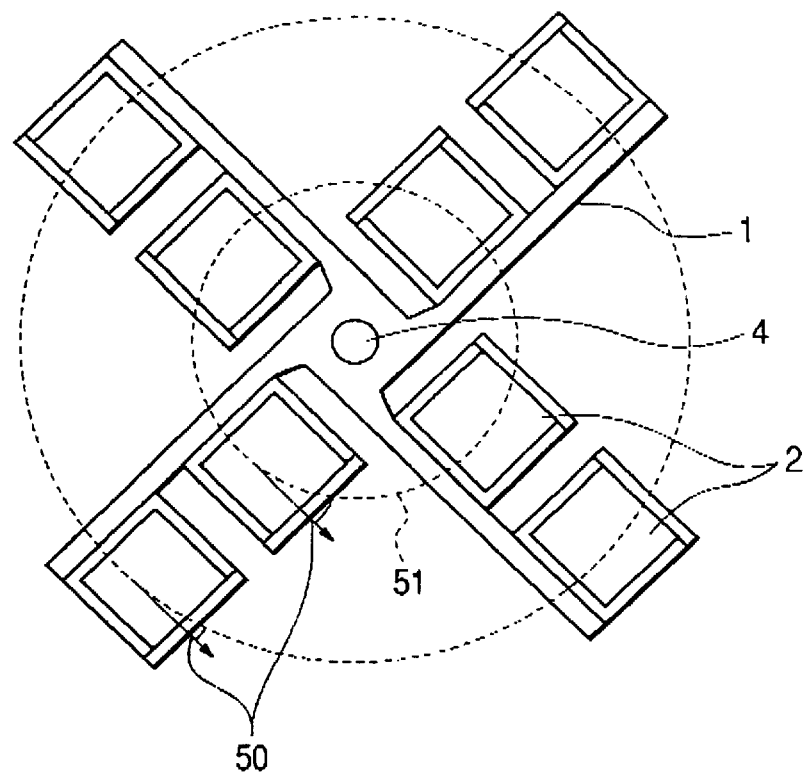
FIG. 13 is a top plan view of the substrate holder of FIG. 12.
Figure 14:
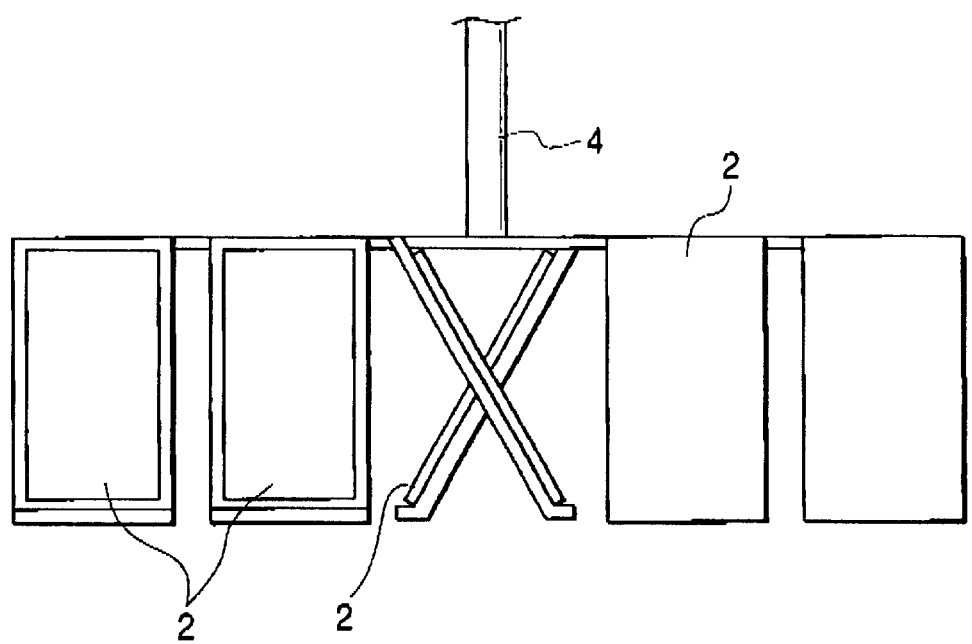
FIG. 14 is a side view of the substrate holder of FIG. 12.
Figure 15:
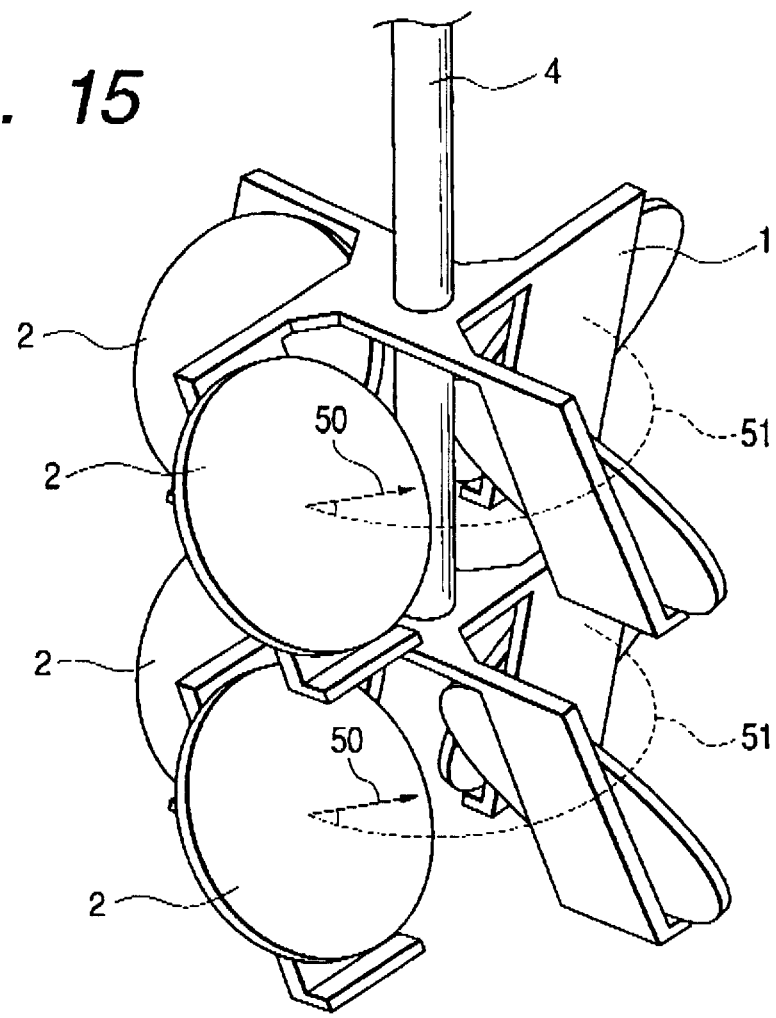
FIG. 15 is a perspective view of another example of the substrate holder of the present invention.
Figure 16:
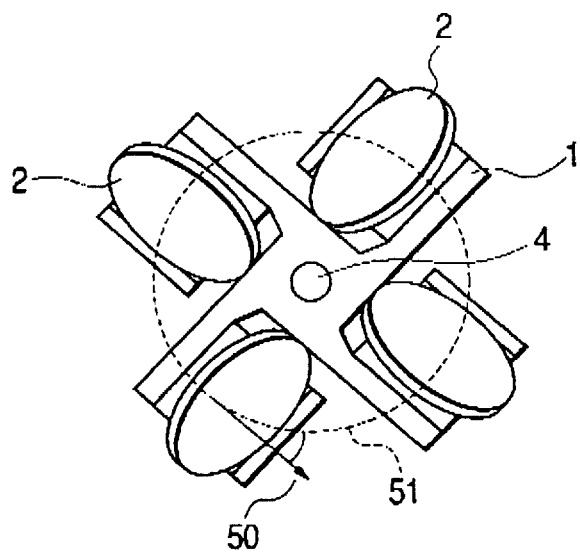
FIG. 16 is a top plan view of the substrate holder of FIG. 15.

At the time of using a large-size crucible in which a plurality of substrates can be batch-treated, the substrates may be arranged in such a manner as to form a plurality of substrate lines along a plurality of circumferences having one common central axis. For example, at the time of using a crucible having a large diameter compared with the size of the substrates, the substrates may be arranged along a plurality of circumferences having different radii lying on the same plane, as shown in FIG. 12. FIG. 13 shows a top plan view of the apparatus of FIG. 12, and FIG. 14 a side view of the apparatus of FIG. 12. At the time of using a deep crucible compared with the size of the substrates, the substrates may be arranged along a plurality of circumferences with the same radius lying on the different planes staggered up or down, as shown in FIG. 15. FIG. 16 shows a top plan view of the apparatus of FIG. 15, and FIG. 17 a side view of the apparatus of FIG. 15.

However, in actual design of those apparatus, it can sometimes be difficult to arrange a plurality of substrates in such a manner that they have rotational symmetry to the central axis. Further, in such constructions, it can sometimes be difficult to mount or dismount substrates on or from a substrate holder. In such cases, a plurality of substrates can be arranged and divided to a plurality of groups of substrates in such a manner that the substrates in each group are arranged parallel to each other, and then the groups of substrate are arranged in such a manner as to have rotational symmetry to the central axis. Such a construction produces almost the same effect as described above on the generation of the solution circulation. In this case, too, the groups of substrates can be arranged along a plurality of circumferences; specifically, the constructions are as shown in FIGS. 18 to 20, FIGS. 21 to 23, and FIGS. 24 to 26. In each group of the figures includes a perspective view, a side view and a top plan view of the same apparatus.

In the production method of the semiconductor thin films of the present invention, as a solvent for use in preparing a solution containing a semiconductor, metals such as In, Sn, Al, Cu and Ga can be used. And the types of the semiconductor thin films producible include, for example, not only Si but also compound semiconductors such as GaAlAs, InGaAsP, GaP, GaAsP and HgCdTe.

Further, in the production method of the semiconductor thin films of the present invention, as materials of the substrate subjected to epitaxial growth of semiconductor thin films, not only semiconductor substrates such as Si, InP, GaP and CdTe but also metallurgical grade Si substrate, metal substrates such as ceramic substrate and SUS substrate, and dissimilar materials such as glass may be used. The substrate may take the form not only of a circular wafer but also of a rectangle.

The products produced according to the method for producing semiconductor thin films of the present invention include, for example, solar cells, SOI substrates, epitaxial wafers and light-emitting diodes.

The examples of the present invention will be described below. Example 1 is a production example of a solar cell, characterized in that single-crystalline silicon thin films are grown on a plurality of substrates while providing a reciprocating motion on a straight line to the plurality of substrates in a solution. Example 2 is a production example of an epitaxial wafer, characterized in that single-crystalline silicon thin films are grown on a plurality of substrates while providing a rotational motion to the plurality of substrates in a solution. Example 3 is also a production example of an epitaxial wafer. Example 4 is a production example of a light-emitting diode, characterized in that compound semiconductor thin films are grown on a plurality of substrates while providing a rotational motion to the plurality of substrates in a solution. It is to be understood that the present invention is not limited to the examples described below but is intended to embrace examples which are the combinations of any of the examples described below.

In each example of the present invention, the same parts and the parts corresponding to each other will be denoted by the same reference numerals.

EXAMPLE 1

This example is a production example of a solar cell, characterized in that single-crystalline silicon thin films are grown on a plurality of substrates while providing, in a solution, a linear motion to the plurality of substrates held in such a manner that the angle between the normal line on the central portion of the growing surface of each substrate and the direction of the substrate movement is set to a predetermined value. FIG. 5 is a sectional view of the liquid phase growth apparatus in accordance with this example of the invention. This liquid phase growth apparatus is mounted with a mechanism which provides a reciprocating motion in the horizontal direction to the plurality of substrates, whereby the flow of the solution is created.

The above liquid phase growth apparatus includes a quartz reaction tube 7 in which a crucible 6 filled with a metal solution 5 is provided. The crucible 6 is a quartz glass container. Above the crucible 6, a substrate holder introducing rod 4 is arranged which is equipped with a up-and-down mechanism for dipping the substrates in the metal solution 5 and a mechanism for moving the substrates right and left in the solution. To the substrate holder introducing rod 4 is connected a substrate holder 1 capable of holding five substrates which holds the substrates in such a manner that the normal line defined on the growing surface of each substrate makes the angle of 45 degrees with respect to the horizontal line. Reference numeral 8 denotes a heater. A dissolving substrate as means for dissolving a semiconductor solute in the metal solution can be mounted on the same holder for holding the substrates for growth, and the solute is supplied by dipping the dissolving substrate in the metal solution before starting the growth of semiconductor thin films.

FIGS. 6A to 6H are sectional views showing the steps of producing single-crystal-based solar cells of Example 1. First, a single-crystalline Si substrate 11 shown in FIG. 6A was subjected to anodization to form a porous Si layer 12. The process for forming a porous Si layer by the anodization is well known (refer to, for example, T. Unagami and M. Seki, J. Electrochem. Soc 125, 8 (1978)) and concentrated hydrofluoric acid (49% HF) is used as a HF-based etching solution. Since hydrogen bubbles are generated from Si wafers during the anodization, alcohol was added thereto to remove the bubbles. The process of applying ultrasonics has been also adopted to remove hydrogen bubbles.

Figure 6A:
FIGS. 6A, 6B, 6C, 6D, 6E, 6F, 6G and 6H are sectional views showing steps of producing solar cells in accordance with Embodiment 1 of the present invention.
Figure 6B:
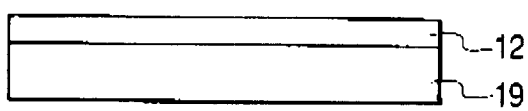
Figure 6C:
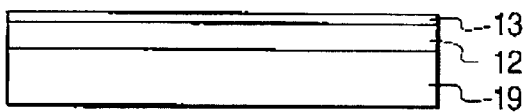
Figure 6D:
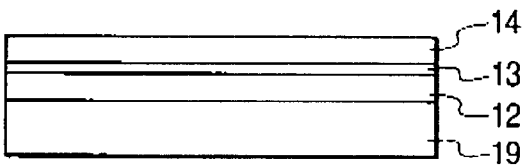

The thickness of the porous Si layer 12 was set to 10 $\mu$m. The porous Si layer 12, as shown in FIG. 6B, was formed on the surface of the single-crystalline Si substrate 11 in the above step. And the substrate was put into the liquid phase growth apparatus.

The procedure of the liquid phase growth on this substrate is shown in FIGS. 7A to 7G. First, a dissolving Si substrate 20 was held in a substrate holder 1, and then the substrate holder 1 was lowered with the up-and-down mechanism, dipped in the solution 5 of In mixed with 10% by weight of Ga (hereinafter referred to as "In+Ga solution") at 900° C. for 20 minutes, so as to dissolve Si as a raw material therein to saturate the solution with Si (refer to FIG. 7A).

Figure 7A:
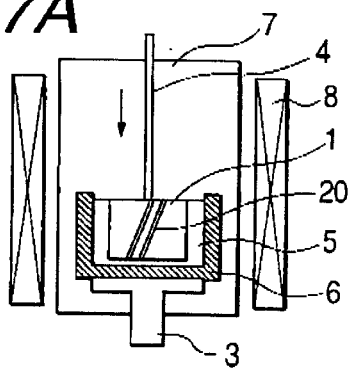
FIGS. 7A, 7B, 7C, 7D, 7E, 7F and 7G are sectional views showing a state of the apparatus in the steps of producing solar cells in accordance with Embodiment 1 of the present invention.
Figure 7E:
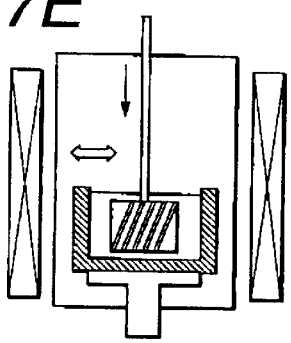
Figure 7B:
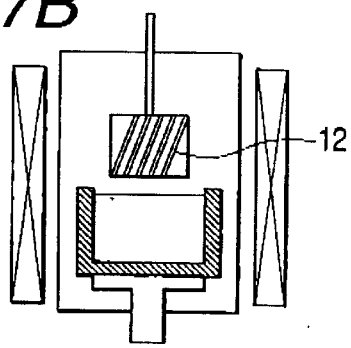
Figure 7F:
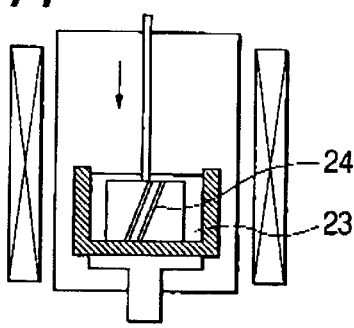
Figure 7C:
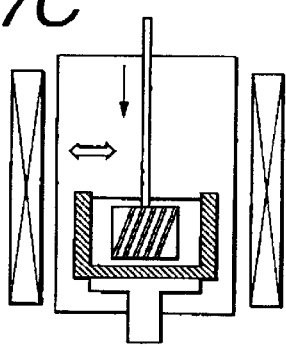
Figure 7G:
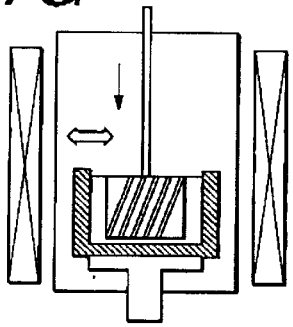
Figure 7D:
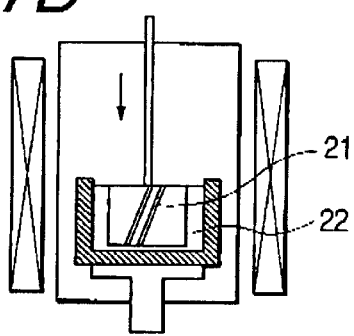

After that, the substrate holder 1 in which the dissolving Si substrate 20 has been set was lifted, the substrate 12 for growth on which the porous Si has been formed was set in the substrate holder 1, hydrogen anneal was conducted at 1020° C. by introducing hydrogen through an atmospheric gas introducing port (not shown in the drawings) before the substrate 12 was dipped in the In+Ga solution 5 (refer to FIG. 7B). Then the metal solution 5 and the dissolving substrate were cooled to 890° C. to supersaturate the In+Ga solution 5 with Si. At this point, the substrate holder 1 was lowered with the up-and-down mechanism so as to dip the substrate for growth in the In+Ga solution 5, the metal solution was further cooled while providing a reciprocating motion right and left to the substrate 10 times per minute, whereby a $p^+$-Si layer 13 about 2 μm thick was grown on the porous Si layer 12 in 5 minutes (refer to FIG. 7C). In the process of the growing though In in the solution was hardly incorporated into the Si layer 13, much of Ga was incorporated thereinto so as to function as a p-type dopant. The sheet resistance distribution of the $p^+$-Si layer 13 was $100\pm\Omega\square$.

Then the In+Ga solution 5 in the crucible was replaced with an In solution 22, and a dissolving substrate was dissolved in the metal solution in the same manner as described above (refer to FIGS. 7D and 7E). In this case, Si was dissolved in the metal solution at 1000° C., and at the time when the metal solution was cooled to 990° C., the substrate was dipped in the In solution while providing a reciprocating motion right and left to the substrate 10 times per minute, whereby a $p^-$-Si layer 14 was grown in 15 minutes (refer to FIG. 7E). The thickness distribution of the $p^-$-Si layer 14 in a plane was 30±2 μm.

After that, the In solution 22 in the crucible was replaced with an Sn solution 23 for $n^+$-Si growth, and the dissolving substrate was replaced with $n^+$-Si 24, which was dissolved in the Sn solution at 800° C. (refer to FIG. 7F). A single-crystalline $n^+$-Si layer 15 about 0.2 μm thick underwent liquid phase growth in 5 minutes (refer to FIG. 7G).

Figure 6E:
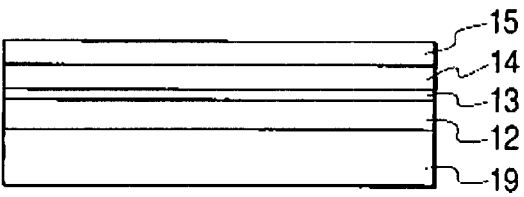

Thus, the single-crystalline $p^+$-Si layer 13, $p^-$-Si layer 14 and $n^+$-Si layer 15 were grown on the Si substrate via the porous Si layer 12 (refer to FIG. 6E).

Figure 6F:
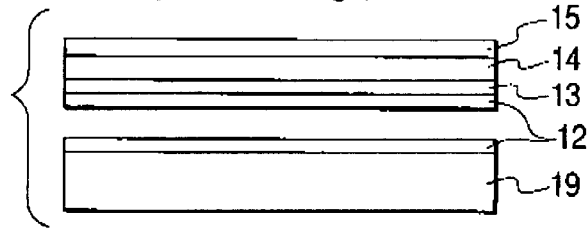

At this point, a wedge was inserted into the porous Si layer 12 to separate the Si layer which is to become a solar cell and the Si substrate 19 (refer to FIG. 6F). The porous Si layer 12 is inferior in mechanical strength, such as tensile, compressive and shear strength, to the Si wafer and the Si layer grown in liquid phase, since the porous Si layer has many voids formed therein. Therefore, when inserting a wedge into the porous Si layer, it fractures, whereby the Si layer was peeled off. Further, the porous Si layer 12 has a large surface area relative to its volume, and therefore the chemical etching of the porous Si layer is markedly accelerated compared with non-porous single-crystalline Si. Thus, the Si substrate 19 and the single-crystalline layer can be separated from each other at the porous Si layer 12 not only mechanically by pulling an adhesive tape attached to the surface of the single-crystalline layer, but also separated by dipping the porous Si layer in an etching solution.

Figure 6G:
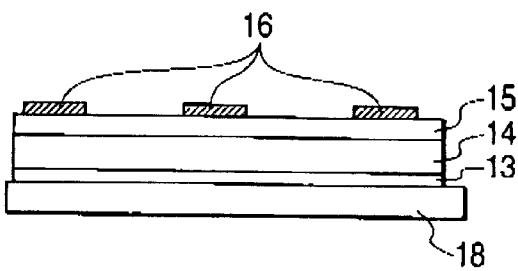
Figure 6H:
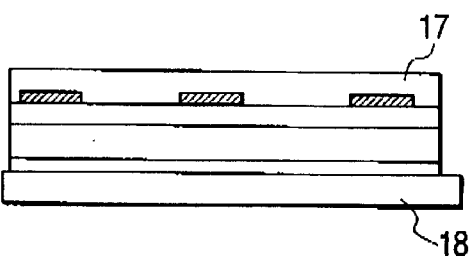

After the separation, a stainless sheet as a conductive substrate 18 was adhered to the lower surface of the $p^+$-Si layer 13, grid electrodes 16 were formed on the surface of the $n^+$-Si layer 15 by the method of printing, etc., as shown in FIG. 6G, an anti-reflection layer 17 was formed on the surface of the $n^+$-Si layer 15 (refer to FIG. 6H), thereby completing a unit of solar cell. At the time of evaluating the solar cell with an AM-1.5 solar simulator, the average conversion efficiency was 15%, showing that the properties of the solar cell were satisfactory.

On the other hand, in order to check the lower limit of the angle θ with which the effect of the present invention was shown, substrate holders with different angles were prepared and comparison was made between them. At the time of using a substrate holder 1 with the angle θ=4 degrees, provided that the conditions other than the angle θ are the same as the other substrate holders, the sheet resistance distribution of the $p^+$-Si layer 13 was 250±150 Ω/□ and the thickness distribution of the $p^-$-Si layer 14 was 14±6 μm, which indicated that the $p^+$-Si layer 13 was markedly highly resistant and the $p^-$-Si layer 14 was markedly thin. Particularly at the central portion of the substrate, the film thickness tended to be small and the film resistance tended to be high. Further, the conversion efficiency of the solar cell produced was markedly decreased to 8% on average. At the time of using a substrate holder 1 with the angle θ=6 degrees, the sheet resistance distribution of the $p^-$-Si layer 13 was 135±35 Ω/□ and the thickness distribution of the $p^-$-Si layer 14 was 25±5 μm, and the average conversion efficiency was 13%, which indicates a marked improvement. The reason for this may be that the In solution did not flow among the substrates, as shown in FIG. 29, when the angle θ=4 degrees, while the In solution flowed among the substrates, as shown in FIG. 28, when the angle θ=6 degrees. In this example, since the substrates performed a reciprocating motion, when they moved back, the θ=5 degrees substantially corresponded to the angle θ=175 degrees.

EXAMPLE 2

Figure 17:
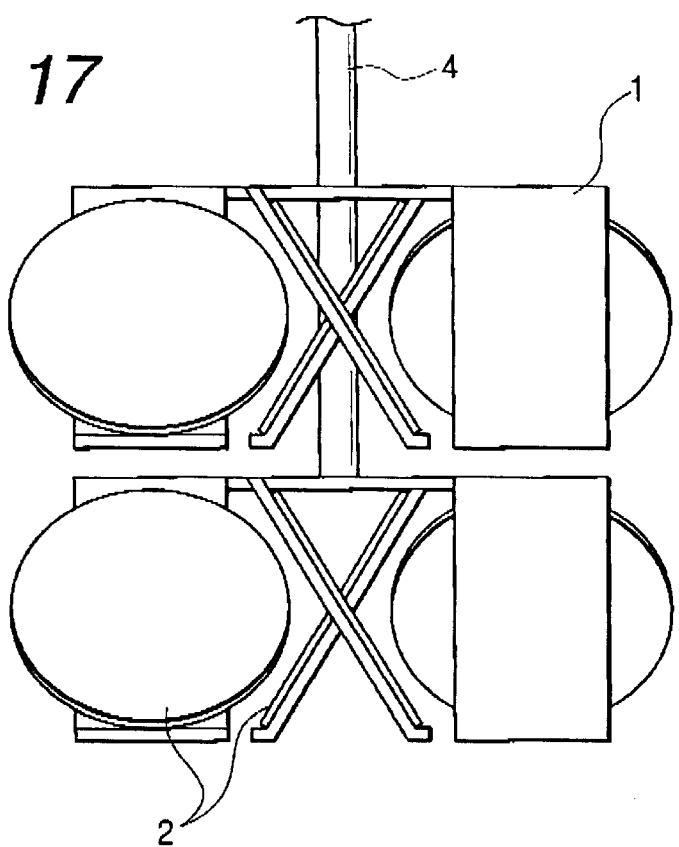
FIG. 17 is a side view of the substrate holder of FIG. 15.
Figure 18:
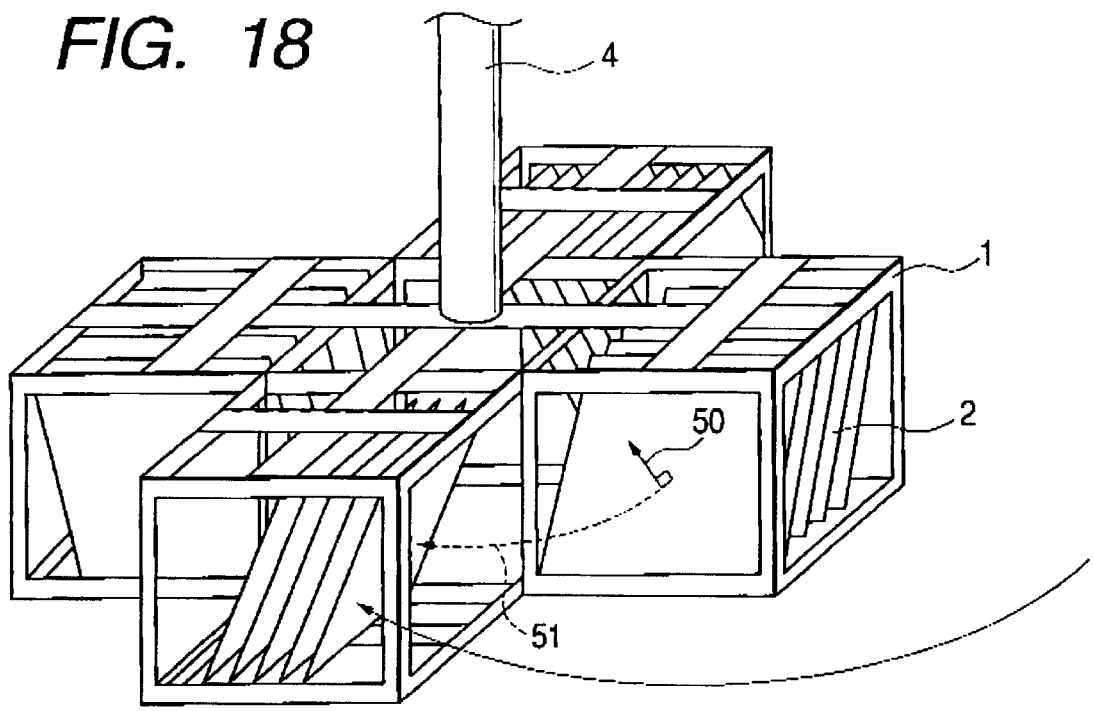
FIG. 18 is a perspective view of still another example of the substrate holder of the present invention.
Figure 19:
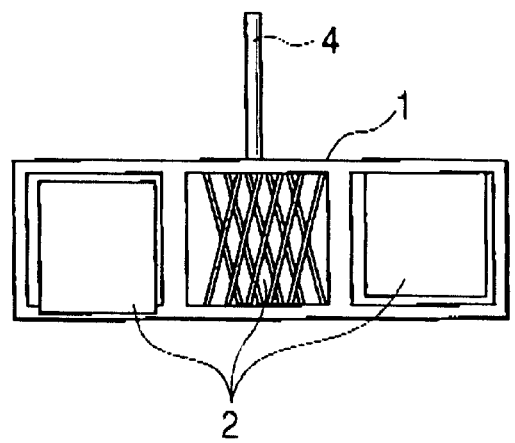
FIG. 19 is a side view of the substrate holder of FIG. 18.
Figure 20:
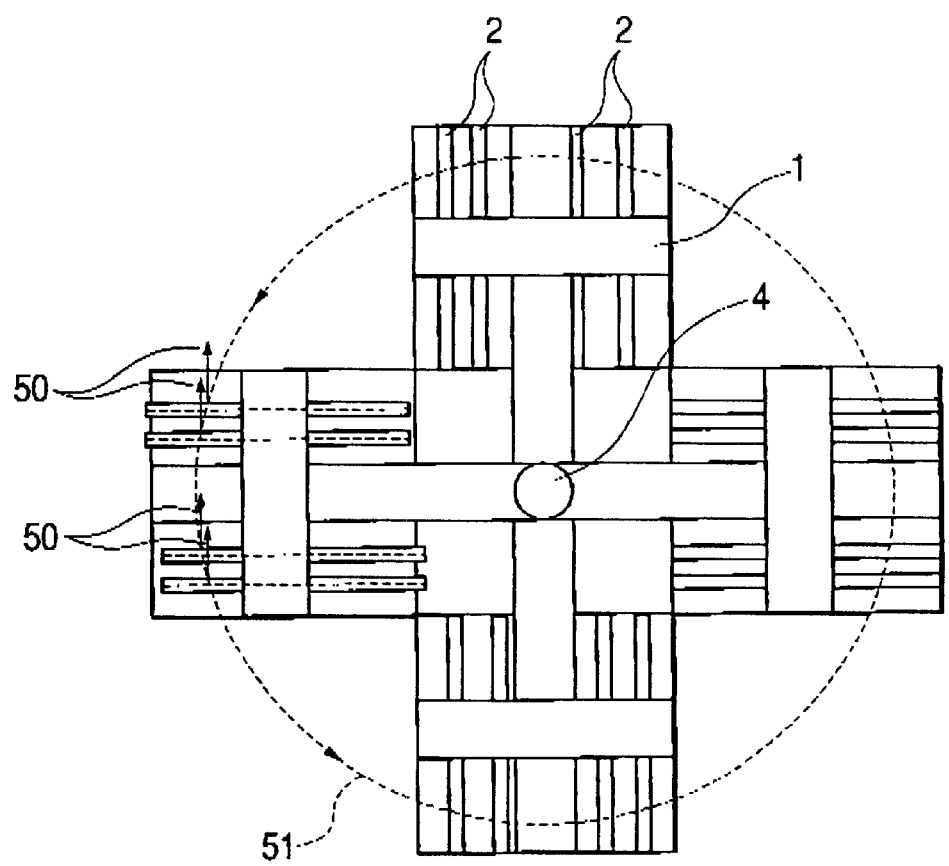
FIG. 20 is a top plan view of the substrate holder of FIG. 18.
Figure 21:
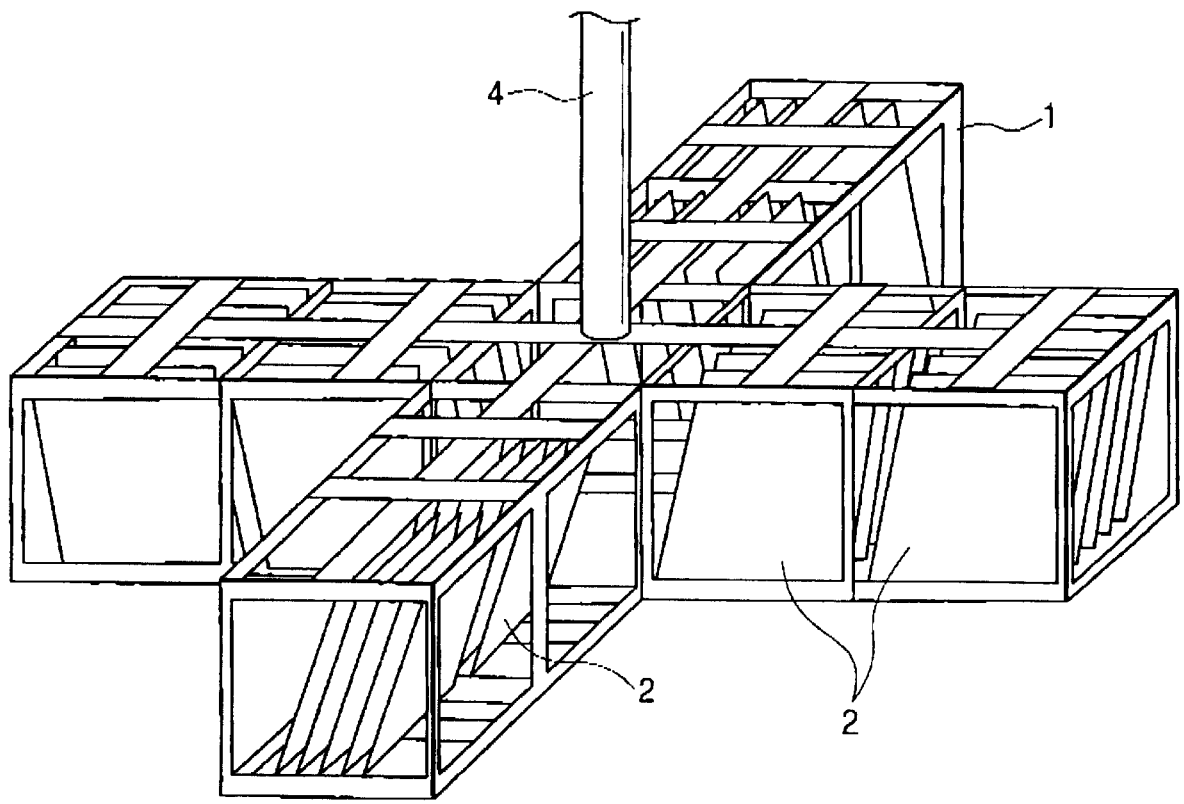
FIG. 21 is a perspective view of still another example of the substrate holder of the present invention.
Figure 22:
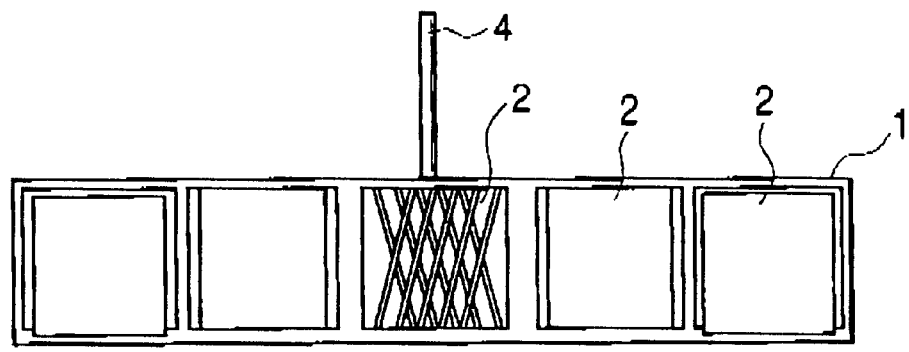
FIG. 22 is a side view of the substrate holder of FIG. 21.
Figure 23:
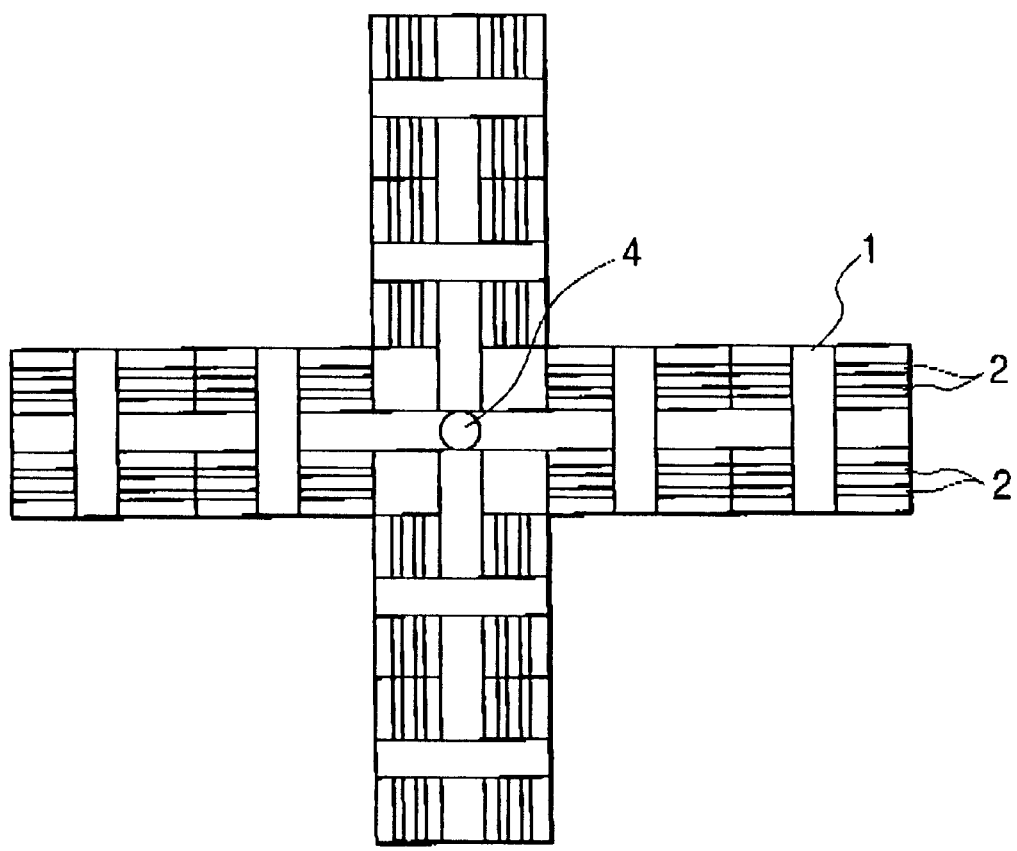
FIG. 23 is a top plan view of the substrate holder of FIG. 21.
Figure 24:
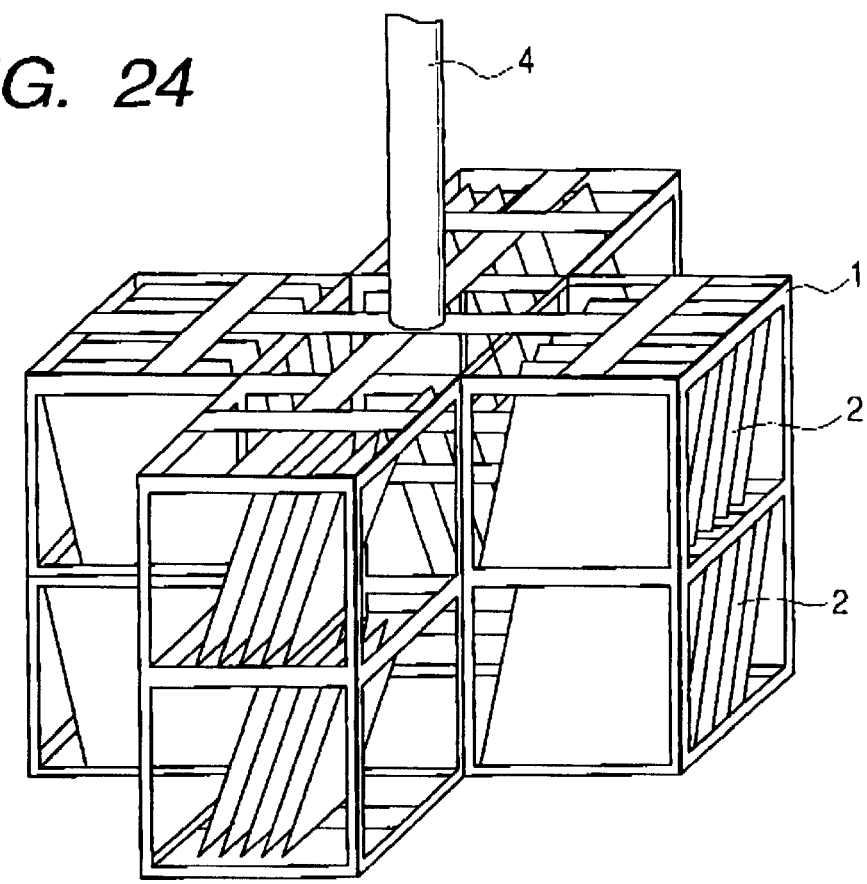
FIG. 24 is a perspective view of another example of the substrate holder of the present invention.
Figure 25:
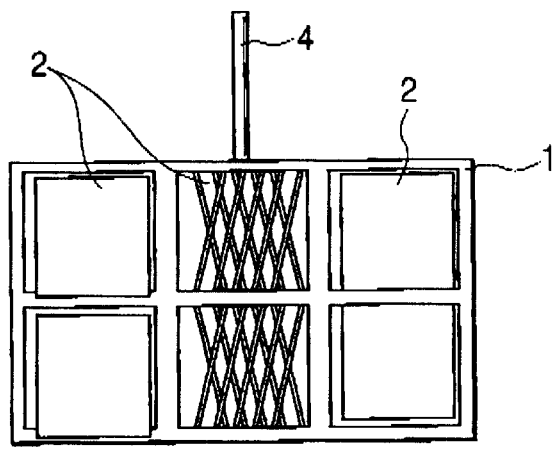
FIG. 25 is a side view of the substrate holder of FIG. 24.
Figure 26:
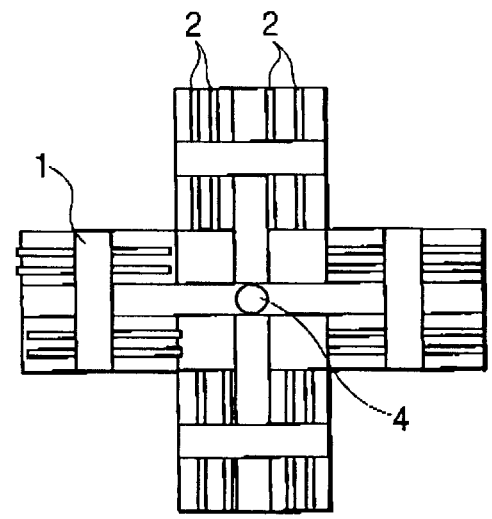
FIG. 26 is a top plan view of the substrate holder of FIG. 24.

This example is a production example of an epitaxial wafer, characterized in that semiconductor thin films are allowed to grow on a plurality of substrates while providing, in a solution, a rotational motion to the plurality of substrates held in such a manner that an angle θ between the normal line on the central portion of the growing surface of each substrate and the direction of the substrate movement is set to a predetermined value and that $p^=$-Cz silicon wafer 6 inches in diameter with face orientation (100) was used. FIG. 15 is a perspective view of the substrate holder used in this example. FIGS. 16 and 17 are a top plan view and a side view of the substrate holder, respectively. Although the example in which the angle θ=45 degrees was shown herein, substrate holders having the angle θ=0, 5, 30, 45, 60, 87, 90, 93, 135, 175 and 180 degrees were also prepared, for comparison.

First, a dissolving B-doped $p^-$-Si substrate was held in a substrate holder, and then the substrate holder 1 was lowered with the up-and-down mechanism, dipped in the In solution 5 at 950° C. for 20 minutes, so as to dissolve Si as a raw material therein to saturate the solution with Si.

After that, the substrate holder 1 in which the dissolving $p^-$-Si substrate had been set was lifted, 8 sheets of (100) $p^+$-Cz silicon wafers, as substrates 2 for growth, were set in the substrate holder 1, and hydrogen anneal was conducted at 1000° C. by introducing hydrogen through an atmospheric gas introducing port (not shown) before the substrate 12 was dipped in the In solution, so as to remove native oxide films on the surface of the substrates 2. Then, the In solution was cooled to 940° C. to supersaturate the In solution with Si. At this time, the substrate holder 1 was lowered with the up-and-down mechanism so as to dip the substrates for growth in the In solution, the In solution was further cooled while providing a counterclockwise rotational motion (seen from the top) to the substrates 10 times per minute to thereby allow a Si layer to grow on the substrates 2. After allowing Si layer to grow for 20 minutes, the substrate holder 1 was lifted to detach the substrates. Although deposition of In was hardly observed on the surface of the grown Si layer, the substrates were dipped in hydrochloric acid for 30 minutes just to make sure that the metal content was completely removed. In the process of the growing, though In in the solution was hardly incorporated into the Si layer, B melted away from the dissolving substrate was incorporated thereinto, and the specific resistance of the Si layer became about 1 to 2 Ωcm. Thus, as an epitaxial wafers, p$^+$-wafers with a p$^-$-Si layer stacked thereon were formed.

The measurements of the grown p$^-$-Si layer thickness are shown in Table 1. In this case are shown the average and the distribution of p$^-$-Si layer thickness of 4 sheets of substrates in the upper tier and those of 4 sheets of substrates in the lower tier.

TABLE 1

| Angle Θ of Substrate Holder | Si Layer Thickness (Upper Tier) | Si Layer Thickness (Lower Tier) |
|---|---|---|
| 0° | 8 ± 3 μm | 5 ± 2 μm |
| 5° | 9 ± 2 μm | 8 ± 1.5 μm |
| 30° | 10 ± 1 μm | 9 ± 1 μm |
| 45° | 10 ± 1 μm | 10 ± 1 μm |
| 60° | 10 ± 1 μm | 10 ± 1 μm |
| 87° | 11 ± 1 μm | 9 ± 1 μm |
| 90° | 12 ± 1 μm | 7 ± 0.5 μm |
| 93° | 11 ± 1 μm | 9 ± 1 μm |
| 135° | 9 ± 1 μm | 9 ± 1 μm |
| 175° | 8 ± 2 μm | 7 ± 1.5 μm |
| 180° | 6 ± 3 μm | 4 ± 2 μm |

When the angle θ was in the range of 5 degrees to 87 degrees and of 93 degrees to 175 degrees, the average thickness was almost the same for the Si layers of the substrates in both upper and lower tiers and the distributions were narrow. When the angle θ was 0 degree, 90 degrees and 180 degrees, however, the thickness of the Si layer of the substrates in the lower tier markedly decreased. Further, when the angle θ was 0 degree and 180 degrees, the Si layer thickness markedly decreased in the middle portion of the substrates, and the distribution expanded. The reason for this may be that, when the angle θ was 0 degree, 90 degrees and 180 degrees, since the circulation of the In solution was not satisfactory, a solution with high concentration of Si, which is low in specific gravity. tends to be held up upward, while Si was not sufficient at the portion near the bottom of the crucible and the growth rate was decreased. It can also be considered that, when the angle θ was 0 degree and 180 degrees, the supply of melt having high Si concentration to the middle portion of the substrates was not sufficient, resulting in a markedly expanded thickness distribution.

EXAMPLE 3

In this example, epitaxial wafers were produced using the same liquid phase growth apparatus as that of Example 2, and the production conditions and dependency on the jig used were investigated in detail. Specifically, various rotational speeds of 10 rpm, 20 rpm and 30 rpm were used. And comparison was made between the substrates holders having the angle θ of 45 degrees and 135 degrees, respectively. In the epitaxial wafers, preferably the epitaxial growth progresses with a high accuracy not on the backside of each substrate, but on the surface portion of the substrate for growth inside a predetermined width from its edges. Therefore, in order not to allow the growth outside of the desired portion, the combination of a substrate supporting plate and a peripheral ring having a structure with a cross-section shown in FIG. 34 or 35 was used.

After allowing a p$^-$-Si layer to grow on each substrate in the same manner as in Example 2, the thickness of the p$^-$-Si layer of each of 8 sheets of substrates and the distribution thereof were measured for each case. In this example, since the angle θ was set to ideal values, no difference was observed in thickness of the Si layer among the substrates in the upper and lower tiers, the results of the measurement were not classified according to which tier the substrates were held, upper tier or lower tier.

Figure 34:
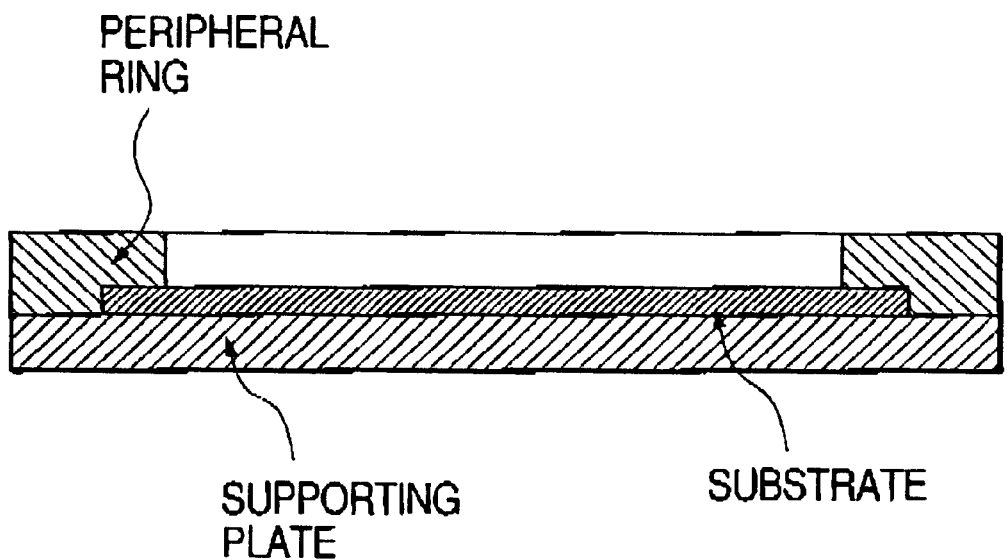
FIG. 34 is a view showing an example of peripheral rings used in substrates.
Figure 35:
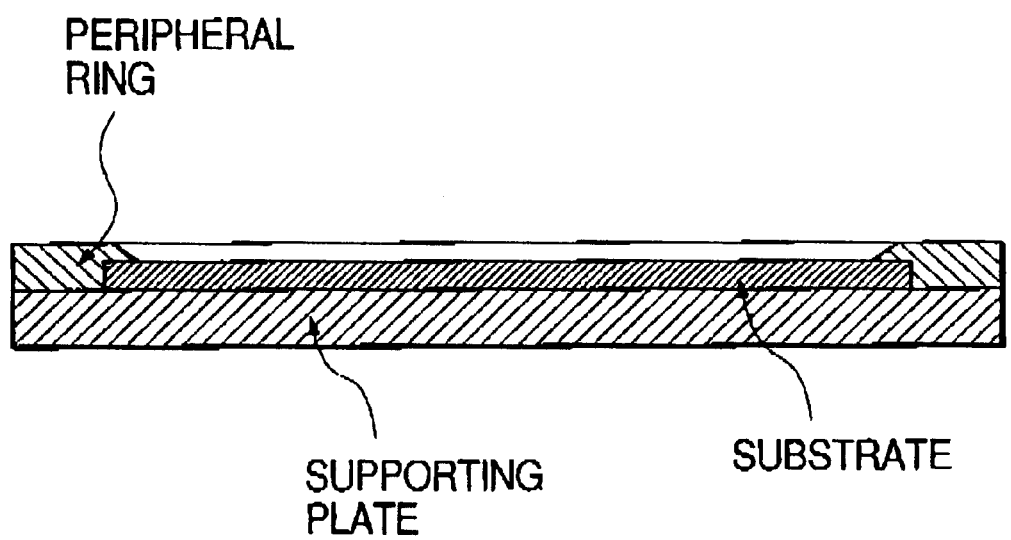
FIG. 35 is a view showing an example of the improved peripheral rings used in substrates.

Table 2 shows the results obtained at the time of using the peripheral ring as shown in FIG. 34 and Table 3 the results obtained at the time of using the peripheral ring as shown in FIG. 35.

TABLE 2

| Use of Substrate Supporting Ring of FIG. 34 | | |
|---|---|---|
| r.p.m. of Substrate Holder | Thickness of Si Layer(Θ = 45°) | Thickness of Si Layer(Θ = 135°) |
| 10 r.p.m. | 10 ± 1 μm | 9 ± 1 μm |
| 20 r.p.m. | 11 ± 1 μm | 8.5 ± 2.5 μm |
| 30 r.p.m. | 11.5 ± 1.5 μm | 8 ± 3 μm |

TABLE 3

| Use of Substrate Supporting Ring of FIG. 35 | | |
|---|---|---|
| r.p.m. of Substrate Holder | Thickness of Si Layer(Θ = 45°) | Thickness of Si Layer(Θ = 135°) |
| 10 r.p.m. | 10 ± 1 μm | 9 ± 1 μm |
| 20 r.p.m. | 11 ± 1 μm | 9.5 ± 1 μm |
| 30 r.p.m. | 12 ± 1 μm | 8.5 ± 1.5 μm |

As seen from Table 2, when the angle θ=45 degrees, the thickness of the Si layer tends to be slightly thicker with the increase in r.p.m., but the distribution does not expand. When the angle θ=135 degrees and r.p.m. is 20 or more, the thickness is markedly decreased in the half area of the substrate from its tip in the substrate movement direction and the distribution of thickness expands. Although the similar tendency is observed in Table 3, even when the angle θ=135 degrees, the expansion of the distribution is not observed unless r.p.m. is more than 20.

When the angle θ=135 degrees (the growing surface of each substrate is directed to the downstream side), with the increase in r.p.m., vortical flow becomes likely to be generated at the downstream side, as shown in FIG. 31. It is considered that this fact causes the distribution of the film thickness to expand when r.p.m. of the substrate holder is increased. Further, at the time of using a peripheral ring, in the edge of each substrate where the ring and each substrate are in contact with each other, the flow of the solution is disturbed and vortical flow is likely to be generated. Particularly when the angle θ=135 degrees, that is, when the growing surface is directed downward, the tendency is considered to be strong. However, in the case shown in Table 3 where a peripheral ring shown in FIG. 35 is used, since the peripheral ring has been made thinner and the cross-sectional form of the ring has been devised so as hardly to cause the solution to be stagnant, vortical flow is unlikely to be generated even at the same r.p.m. as in the case where the peripheral ring shown in FIG. 34 is used.

EXAMPLE 4

This example is an example of a production method of a light-emitting diode, characterized in that semiconductor thin films are allowed to grow on a plurality of substrates, which are held in such a manner that the angle θ between the direction of the normal line on the growing surface of each substrate and the direction of the substrate movement is set to a predetermined value, while providing a rotational motion to the plurality of substrates in a solution.

Figure 8:
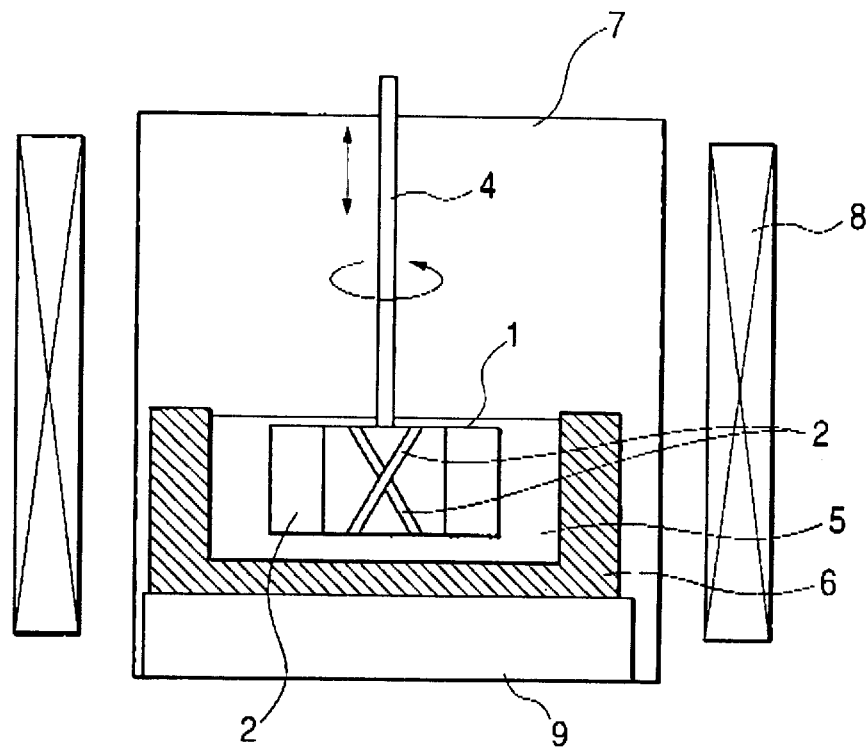
FIG. 8 is a schematic side view of a liquid phase growth apparatus in accordance with Embodiment 2 of the present invention.
Figure 10:
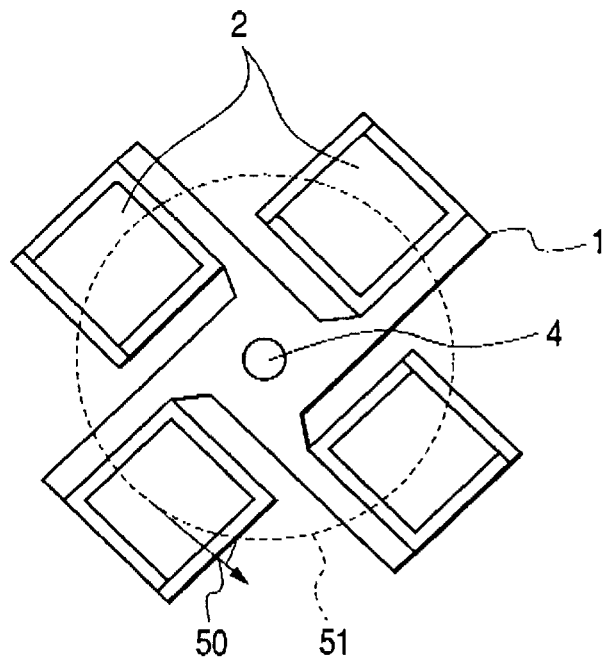
FIG. 10 is a top plan view of the substrate holder of FIG. 9.
Figure 11:
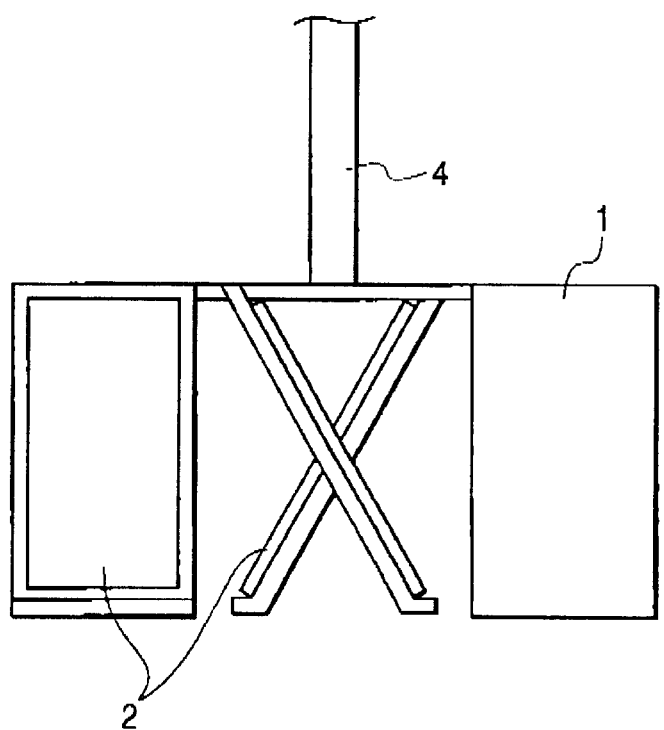
FIG. 11 is a side view of the substrate holder of FIG. 9.

FIG. 8 is a sectional view of the liquid phase growth apparatus used in this example. This liquid phase growth apparatus is mounted with a mechanism for rotating a substrate holder as a substrate moving mechanism. The angle θ between the direction 50 of the normal line on each substrate and the movement direction 51 of the substrates is 45 degrees, and substrate holder can be mounted with 4 sheets of rectangular substrates. FIGS. 9, 10 and 11 are a perspective view, a top plan view and a side view of the substrate holder, respectively.

Figure 27A:
FIGS. 27A, 27B, 27C, 27D, 27E, 27F, 27G and 27H are sectional views showing steps of producing light emitting diodes in accordance with Embodiment 2 of the present invention.
Figure 27B:

FIGS. 27A to 27H are sectional views showing the steps of producing the light-emitting diode of Example 4. In this example, an n-type InP substrate 40 was prepared, as shown in FIG. 27A. Then, an InP solution containing a n-type dopant was put into a crucible in the liquid phase growth apparatus, and an n-type InP layer 41 as a buffer layer was formed as shown in FIG. 27B.

Figure 27C:
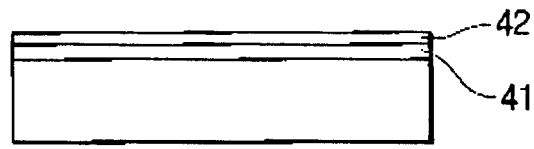
Figure 27D:
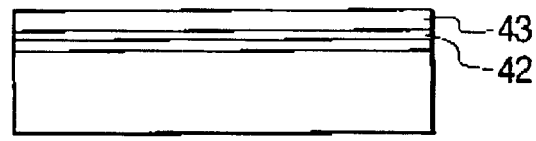
Figure 27E:
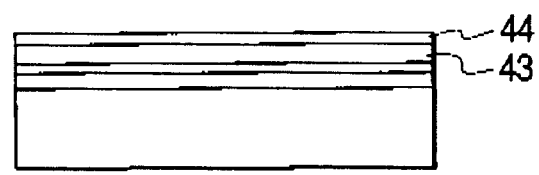

After that, the solution in the crucible was replaced with a InGaAsP solution containing no dopant, and an InGaAsP layer 42 as an active layer was formed as shown in FIG. 27C. Then, the solution was replaced with an InP solution containing a p-type dopant, and an InP layer 43 as a p type cladding layer was formed (refer to FIG. 27D), followed by the formation of a p type InGaAsP layer 44 as a cap layer (refer to FIG. 27E).

At the time of providing a rotational motion to each substrate during the growth of each layer, the substrate surface comes in contact with the solution newly supplied thereto in succession, which allows not only improvement in film forming rate, but also an efficient circulation of the solution in the crucible, and hence an efficient agitation.

As a result, an Si layer effectively grew on each of the plurality of substrates. In providing a rotational motion to the substrates, an up-and-down motion may be provided simultaneously to perform a spiral motion of the substrates as a whole.

Figure 27F:
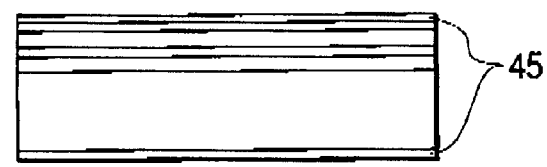

The substrates were taken out from the liquid phase growth apparatus, and electrodes 45 were formed on the back side of the n-type InP substrate 40 and on the surface of the p-type InGaAsP layer 44 (refer to FIG. 27F). And the light-transmitting portion of the electrode on the p-type InGaAsP layer 44 was removed by etching.

Figure 27G:
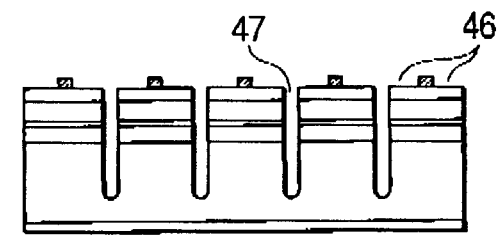
Figure 27H:

Then, the inside of the n-type InP substrate 40 was half-diced into diode chips, as shown in FIG. 27G, which were assembled to complete light-emitting diodes, as shown in FIG. 27H.

According to the present invention, in the case of dipping substrates in a solution containing a semiconductor as a solute, and conducting liquid phase growth while moving the substrates in the solution, when the angle between the direction of the normal line on the central portion of the growing surface of each substrate and the direction of the substrate movement is maintained in a predetermined range, the growing surface comes in contact with the solution in succession and the relative speed of the substrates to the solution is increased, whereby improvement in film forming rate is achieved. At the same time, the substrates themselves create the flow of the solution, which is to agitate the solution suitably, without generating vortical flow of the solution in the vicinity of the growing surface, whereby the uniformity of the thickness of the grown film is also improved. Furthermore, according to the present invention, the use of a just simple mechanism makes it possible to treat a plurality of substrates together, which leads to improvement in mass productivity.

What is claimed is:

1. A method for producing semiconductor thin films, which comprises:
   (a) dipping a plurality of substrates into a solution filled in a crucible, the solution containing a semiconductor as a solute; and thereafter
   (b) growing the semiconductor thin films on the plurality of substrates while moving the plurality of substrates in the solution,
   wherein an angle between a direction of a normal line on a central portion of a growing surface of each of the substrates and a direction of the movement of the substrates is set to be in a range of 5 degrees to 87 degrees, and wherein the movement of the substrates generates a flow of the solution.

2. A method for producing semiconductor thin films, which comprises:
   (a) dipping a plurality of substrates into a solution filled in a crucible, the solution containing a semiconductor as a solute, and thereafter
   (b) growing the semiconductor thin films on the plurality of substrates while moving the plurality of substrates in the solution,
   wherein an angle between a direction of a normal line on a central portion of a growing surface of each of the substrates and a direction of the movement of the substrates is set to be in a range of 93 degrees to 175 degrees, and wherein the movement of the substrates generates a flow of the solution.

3. A method for producing semiconductor thin films, which comprises dipping a plurality of substrates into a solution filled in a crucible, the solution containing a semiconductor as a solute, and growing the semiconductor thin films on the plurality of substrates while moving the plurality of substrates in the solution,
   wherein the plurality of substrates perform a reciprocating motion on a straight line as an integral unit, wherein in a forth movement of the substrates, an angle between a direction of a normal line on a central portion of a growing surface of each of the substrates and a direction of the forth movement of the substrates is set to be in a range of 5 degrees to 87 degrees and the forth movement of the substrates generates a flow of the solution, and wherein in a back movement of the substrates, an angle between a direction of the normal line on the center of the growing surface of each of the substrates and a direction of the back movement of the substrates is set to be in a range of 93 degrees to 175 degrees, and the back movement of the substrates generates no substantial vortical flow in a vicinity of the growing surface.

4. The method for producing semiconductor thin films according to claim 1 or 2, wherein the plurality of substrates perform a rotational motion as an integral unit.

5. The method for producing semiconductor thin films according to claim 4, wherein the rotational motion of the plurality of substrates is performed by rotational motion of a holder for holding the substrates.

6. The method for producing semiconductor thin films according to claim 1 or claim 2, wherein the plurality of substrates perform a spiral motion as an integral unit.

7. The method for producing semiconductor thin films according to claim 6, wherein the spiral motion of the plurality of substrates is performed by rotational motion and up-and-down motion of a holder for holding the substrates.

8. The method for producing semiconductor thin films according to any one of claims 1 to 3, wherein the plurality of substrates are directed in such a manner that a plane formed by the normal line on the central portion of the growing surface of each substrate and the direction of the movement of the substrates is about ±1 degree from vertical.

9. The method for producing semiconductor thin film according to any one of claims 1 to 3, wherein the plurality of substrates are directed in such a manner that a plane formed by the normal line on the central portion of the growing surface of each substrate and the direction of the movement of the substrates is about ±1 degree from horizontal.

10. A method for producing semiconductor thin films which comprises:
  (a) dipping a plurality of substrates into a solution filled in a crucible, the solution containing a semiconductor as a solute; and thereafter
  (b) growing the semiconductor thin films on the plurality of substrates while moving the plurality of substrates in the solution,
  wherein an angle between a direction of a normal line on a central portion of a growing surface of each of the substrates and a direction of the movement of the substrates is set to be in a range of 5 degrees to 87 degrees, wherein the movement of the substrates generates a flow of the solution and wherein the plurality of substrates are spaced at predetermined intervals on a circumference having a predetermined straight line as a central axis in such a manner that the substrates have rotational symmetry, and wherein the substrates move along the circumference.

11. A method for producing semiconductor thin films which comprises:
  (a) dipping a plurality of substrates into a solution filled in a crucible, the solution containing a semiconductor as a solute; and thereafter
  (b) growing the semiconductor thin films on the plurality of substrates while moving the plurality of substrates in the solution,
  wherein an angle between a direction of a normal line on a central portion of a growing surface of each of the substrates and a direction of the movement of the substrates is set to be in a range of 93 degrees to 175 degrees, wherein the movement of the substrates generates a flow of the solution and wherein the plurality of substrates are spaced at predetermined intervals on a circumference having a predetermined straight line as a central axis in such a manner that the substrates have rotational symmetry, and wherein the substrates move along the circumference.

12. The method for producing semiconductor thin films according to claim 10 or 11, wherein the circumference is composed of a plurality of circumferences having a common central axis.

13. The method for producing semiconductor thin films according to claim 12, wherein the plurality of circumferences are coplanar and have different radii.

14. The method for producing semiconductor thin films according to claim 12, wherein the plurality of circumferences are coplanar and have the same radius.

15. A method for producing semiconductor thin films which comprises:
  (a) dipping a plurality of substrates into a solution filled in a crucible, the solution containing a semiconductor as a solute; and thereafter
  (b) growing the semiconductor thin films on the plurality of substrates while moving the plurality of substrates in the solution,
  wherein an angle between a direction of a normal line on a central portion of a growing surface of each of the substrates and a direction of the movement of the substrates is set to be in a range of 5 degrees to 87 degrees, wherein the movement of the substrates generates a flow of the solution and wherein the plurality of substrates form a plurality of groups each consisting of substrates arranged parallel to each other, and wherein the groups of substrates are spaced at predetermined intervals on a circumference with a predetermined straight line as a central axis in such a manner that the substrates have rotational symmetry.

16. A method for producing semiconductor thin films which comprises:
  (a) dipping a plurality of substrates into a solution filled in a crucible, the solution containing a semiconductor as a solute; and thereafter
  (b) growing the semiconductor thin films on the plurality of substrates while moving the plurality of substrates in the solution,
  wherein an angle between a direction of a normal line on a central portion of a growing surface of each of the substrates and a direction of the movement of the substrates is set to be in a range of 93 degrees to 175 degrees, wherein the movement of the substrates generates a flow of the solution without generating a substantial vertical flow in a vicinity of the growing surface, and wherein the plurality of substrates form a plurality of groups each consisting of substrates arranged parallel to each other, and wherein the groups of substrates are spaced at predetermined intervals on a circumference with a predetermined straight line as a central axis in such a manner that the substrates have rotational symmetry.

17. The method for producing semiconductor thin films according to claim 15 or 16, wherein said circumference is composed of a plurality of circumferences having a common central axis.

18. The method for producing semiconductor thin films according to claim 17, wherein the plurality of circumferences are coplanar and have different radii.

19. The method for producing semiconductor thin films according to claim 17, wherein the plurality of circumferences are noncoplanar and have the same radius.

* * * * *